(12) United States Patent
Yamada et al.

(10) Patent No.: US 7,074,346 B2
(45) Date of Patent: Jul. 11, 2006

(54) SIALON-BASED OXYNITRIDE PHOSPHOR, PROCESS FOR ITS PRODUCTION, AND USE THEREOF

(75) Inventors: Tetsuo Yamada, Ube (JP); Shin-ichi Sakata, Ube (JP)

(73) Assignee: Ube Industries, Ltd. (JP)

( * ) Notice: Subject to any disclaimer, the term of this patent is extended or adjusted under 35 U.S.C. 154(b) by 0 days.

(21) Appl. No.: 10/770,700

(22) Filed: Feb. 3, 2004

(65) Prior Publication Data

US 2004/0155225 A1   Aug. 12, 2004

(30) Foreign Application Priority Data

Feb. 6, 2003   (JP)   ............... 2003-029274
Feb. 6, 2003   (JP)   ............... 2003-029277

(51) Int. Cl.
G02F 2/02 (2006.01)
C09K 11/59 (2006.01)
C09K 11/64 (2006.01)

(52) U.S. Cl. .................. 252/301.4 F; 252/301.4 R; 257/98; 313/503; 313/483; 313/485; 313/486

(58) Field of Classification Search ......... 252/301.4 F, 252/301.4 R; 313/503, 483, 485, 486; 257/98, 257/E33.061
See application file for complete search history.

(56) References Cited

U.S. PATENT DOCUMENTS 4,845,059 A * 7/1989 Kohtoku et al. ............ 501/98.1
6,066,861 A * 5/2000 Hohn et al. .................. 257/99
6,657,379 B1 * 12/2003 Ellens et al. ................ 313/503

FOREIGN PATENT DOCUMENTS

EP   1 264 873 A2   12/2002
EP   1 278 250 A2   1/2003

(Continued)

OTHER PUBLICATIONS

Rong-Jun Xie et al., *Preparation and Luminescence Spectra of Calcium—and Rare-Earth (R=Eu, Tb, and Pr)-Codoped α-SiAlON Ceramics*, J. Am. Ceram. Soc., 85[5] (2002), pp. 1229-1234.

(Continued)

*Primary Examiner*—Carol Melissa Koslow
(74) *Attorney, Agent, or Firm*—DLA Piper Rudnick Gray Cary US LLP

(57) ABSTRACT

An α-sialon-based oxynitride phosphor characterized in that the content of α-sialon represented by the general formula: $M_xSi_{12-(m+n)}Al_{(m+n)}O_nN_{16-n}:Ln_y$ (wherein M is at least one metal selected from among Li, Ca, Mg, Y or lanthanide metals excluding La and Ce, Ln is at least one lanthanide metal selected from among Ce, Pr and La or at least one lanthanide metal selected from among Eu, Dy, Er, Tb and Yb, $0.3 \leq x+y < 1.5$, $0 < y < 0.7$, $0.3 \leq m < 4.5$, $0 < n < 2.25$, and $m = ax + by$, where a is the valence of the metal M and b is the valence of the lanthanide metal Ln), wherein all or a portion of the metal M dissolved in the α-sialon is replaced with the lanthanide metal Ln as the luminescence center, is 75 wt % or greater when the lanthanide metal Ln is at least one lanthanide metal selected from among Ce, Pr and La and 90 wt % or greater when the lanthanide metal Ln is at least one lanthanide metal selected from among Eu, Dy, Er, Tb and Yb, and in that the content of metal impurities other than the metal M, lanthanide metal Ln, silicon, IIIA elements (aluminum, gallium), oxygen and nitrogen, is no greater than 0.01 wt %.

17 Claims, 3 Drawing Sheets

FOREIGN PATENT DOCUMENTS

| | | |
|---|---|---|
| JP | 62-223009 A | 10/1987 |
| JP | 2001-261447 A | 9/2001 |
| JP | 2002-363554 A | 12/2002 |

OTHER PUBLICATIONS

J.W.H. van Krevel et al., *On the $Ce^{3+}$ Luminescence in the Melilite-Type Oxide Nitride Compound $Y_2Si_{3-x}Al_xO_{3+x}N_{4-x}$*, Materials Research Bulletin 35 (2000), pp. 747-754.

Thommy Ekström et al., *Formation of an Y/Ce-Doped α-Sialon Phase*, Journal of the European Ceramic Society, 1991, vol. 8, pp. 3-9.

H. Mandal et al., *$CeO_2$-doped α-sialon ceramics*, Journal of Materials Science Letters, 1996, vol. 15, pp. 1435-1438.

* cited by examiner

SIALON-BASED OXYNITRIDE PHOSPHOR, PROCESS FOR ITS PRODUCTION, AND USE THEREOF

FIELD OF THE INVENTION

The present invention relates to a material having a function which converts a portion of irradiated light into light with a different wavelength and blends it with the non-converted irradiated light into light with a different color. More specifically, it relates to an oxynitride phosphor activated with a rare earth metal element, which exhibits the high brightness of a white light emitting diode (white LED) using a blue light emitting diode (blue LED) as the light source. The present invention also relates to a process for production of the sialon-based oxynitride phosphor and to its use.

BACKGROUND ART

Phosphors comprising silicates, phosphates (for example, apatite) and aluminates as host materials, with transition metals or rare earth metals added as activating materials to the host materials, are widely known. As blue LEDs, in particular, have become practical in recent years, the development of white light sources utilizing such blue LEDs is being energetically pursued. As white LEDs are expected to have lower power consumption and longer usable lives than existing white light sources, development is progressing toward their applications in backlights of liquid crystal panels, indoor lighting fixtures, backlights of automobile panels and the like.

The currently developed white LEDs generally comprise YAG (yttrium-aluminum-garnet)-based phosphors coated on the surfaces of blue LEDs, with Ce-activated YAG-based phosphors converting the blue light of the blue LEDs to yellow light. A portion of the blue light of 450 nm wavelength emitted by the blue LED penetrates the phosphor layer, while the remainder strikes the phosphor and is converted to yellow light. The blue and yellow colors combine to appear as white light.

YAG-based phosphors, however, are associated with the problem of emission of blue-tinted white light due to a lower intensity when the excitation wavelength exceeds 400 nm, as well as a low light-emitting efficiency because the excitation energy of the blue LED does not match the excitation energy of the YAG-based phosphor. Another problem is inadequate durability of the coated phosphor layer. An improvement has therefore been desired in the performance of phosphors used for wavelength conversion.

In recent years, oxynitride phosphors such as oxynitride glass, β-sialon, α-sialon and the like having nitrogen in the structure have received attention as structurally stable substances capable of shifting excitation light or emitted light toward the long wavelength end. Sialon with α- or β-$Si_3N_4$ crystal structure is a solid solution composed of mainly Si, Al, N and O atoms. Two forms thereof are known, β-sialon and α-sialon, which are both materials with excellent abrasion resistance and corrosion resistance.

The α-sialon is a solid solution with double substitution of Al for Si position and O for N position of α-silicon nitride, with a modifying cation M occupying at the interstitial sites. Chemical composition of α-sialon is represented by the general formula: $M_xSi_{12-(m+n)}Al_{(m+n)}O_nN_{16-n}$ (wherein $0.3 \leq x < 1.5$, $0.3 \leq m < 4.5$, $0 < n < 2.25$, and m=ax where a is the valence of the metal M). Because α-sialon has high hardness and excellent abrasion resistance, various processes for producing sialon-based sintered bodies have been investigated. Li, Mg, Ca, Y and lanthanide metals are known as metals M which dissolve in α-silicon nitride lattice and stabilize its structure, occupying the interstitial sites of the unit lattice of α-silicon nitride.

La and Ce, which are lanthanide metals with large ionic radii, are considered to poorly occupy the interstitial sites of α-silicon nitride. However, simultaneous addition of La or Ce with the aforementioned metal elements has been carried out in an attempt to produce solid solutions with La or Ce occupying the interstitial sites of α-silicon nitride. For example, the Journal of European Ceramic Society, Vol.8, pp.3–9(1991) reports that simultaneous addition of Ce with Y yielded α-sialon having both Ce and Y stabilized therein. Also, the Journal of Materials Science Letters, Vol.15, pp.1435–1438 reports that by rapid cooling from high temperature it is possible to synthesize α-sialon stabilized with Ce (Ce-α-sialon). However, the Ce-α-sialon content is only about 20% while the remaining major portion is β-sialon, and partial formation of a 21R phase, a polytype of AlN, has been confirmed. Moreover, Japanese Unexamined Patent Publication No. 2001-261447 discloses a sialon-based sintered body with high hardness and excellent abrasion resistance, comprising only β-sialon and a grain boundary glass phase in addition to Ce-stabilized α-sialon.

Nevertheless, the aforementioned disclosed technologies all relate to production of sialon-based sintered bodies, and are not directed toward powder production nor toward production of oxynitride phosphors. Furthermore, no reference is made in any way to the effects of the metal impurity concentrations of the obtained sialon-based sintered bodies.

On the other hand, Japanese Unexamined Patent Publication No. 2002-363554 discloses an oxynitride phosphor with an activated rare earth element, represented by the general formula: $M_xSi_{12-(m+n)}Al_{(m+n)}O_nN_{16-n}$: $Re1_yRe2_z$ (wherein $0.3 < x+y+z < 1.5$, $0.01 < y < 0.7$, $0 \leq z < 0.1$, $0.3 < m < 4.5$, $0 \leq n < 1.5$), and having all or a portion of the metal M dissolved in α-sialon (where M is at least one type of metal selected from among Ca, Mg, Y or lanthanide metals excluding La and Ce) replaced with two different lanthanide metals, specifically a lanthanide metal Re1 as the luminescence center (where Re1 is at least one type of lanthanide metal selected from among Ce, Pr, Eu, Er, Tb and Yb) or a lanthanide metal Re2 as the co-activator with the lanthanide metal Re1 (where Re2 is Dy). However, this publication not only lacks any mention regarding the powder properties such as purity, crystal phase and particle size distribution of the rare earth element-activated oxynitride phosphor, but it is also completely unconcerned with properties such as purity, crystal phase and particle size distribution of the $Si_3N_4$, AlN, alkali metals and rare earth metals used as the starting materials for preparation of the oxynitride phosphor.

The present applicant has proposed, in Japanese Unexamined Patent Publication (Kokai) SHOWA No. 62-223009, a process for production of α-sialon powder using as the starting materials (a) amorphous silicon nitride powder, (b) metallic aluminum or aluminum nitride, (c) an oxide of a metal which interstitially dissolves in the α-sialon lattice as a solid solution or a metal salt which produces the metal oxide upon thermal decomposition, and (d) an aluminum or silicon compound containing oxygen.

However, while some effect is achieved to develop α-sialon-based oxynitride with excellent mechanical properties as an abrasion-resistant material, the properties are inadequate from the standpoint of its use as an optical material and, therefore, further improvement has been necessary before it can be practicably utilized.

It is an object of the present invention to provide an oxynitride phosphor composed mainly of rare earth element-activated α-sialon represented by the general formula: $M_xSi_{12-(m+n)}Al_{(m+n)}O_nN_{16-n}:Ln_y$, (wherein $0.3 \leq x+y < 1.5$, $0 < y < 0.7$, $0.3 \leq m < 4.5$, $0 < n < 2.25$, and $m = ax + by$, where a is the valence of the metal M and b is the valence of the lanthanide metal Ln), as a photoluminescent phosphor capable of realizing the high brightness of a white LED using a blue LED as the light source, as well as a process for its production.

DISCLOSURE OF THE INVENTION

The present inventors have discovered that α-sialon having specified contents of metal impurities other than the constituent components can serve as such a photoluminescent phosphor capable of realizing the high brightness of a white LED using a blue LED as the light source. It was further found that adjustment of the oxygen content of the nitrogen-containing silane compound and/or amorphous silicon nitride powder used as starting materials, and addition of α-sialon powder pre-synthesized into a starting powder, are important conditions for producing the α-sialon-based oxynitride photoluminescent phosphor, and the present invention has thus been completed.

In other words, the invention relates to an α-sialon-based oxynitride phosphor characterized in that the content of α-sialon represented by the general formula: $M_xSi_{12-(m+n)}Al_{(m+n)}O_nN_{16-n}:Ln_y$, (wherein M is at least one metal selected from among Li, Ca, Mg, Y or lanthanide metals excluding La and Ce, Ln is at least one lanthanide metal selected from among Ce, Pr and La or at least one lanthanide metal selected from among Eu, Dy, Er, Tb and Yb, $0.3 \leq x+y < 1.5$, $0 < y < 0.7$, $0.3 \leq m < 4.5$, $0 < n < 2.25$, and $m = ax + by$, where a is the valence of the metal M and b is the valence of the lanthanide metal Ln) wherein all or a portion of the metal M dissolved in the α-sialon is replaced with the lanthanide metal Ln as the luminescence center, is 75 wt % or greater when the lanthanide metal Ln is at least one lanthanide metal selected from among Ce, Pr and La and 90 wt % or greater when the lanthanide metal Ln is at least one lanthanide metal selected from among Eu, Dy, Er, Tb and Yb, and in that the content of metal impurities other than the constituent components, i.e. the metal M, lanthanide metal Ln, silicon, IIIA elements (aluminum, gallium), oxygen and nitrogen, is no greater than 0.01 wt %.

According to a preferred mode of the invention, one or more of the following conditions is satisfied: the α-sialon is present at 90 wt % or greater (as measured by powder X-ray diffraction) when the lanthanide metal Ln is at least one lanthanide metal selected from among Ce, Pr and La, and at 95 wt % or greater when the lanthanide metal Ln is at least one lanthanide metal selected from among Eu, Dy, Er, Tb and Yb, with the remainder consisting of β-sialon and oxynitride glass, the content of metal impurities other than the constituent components, i.e. the metal M, lanthanide metal Ln, silicon, IIIA elements (aluminum, gallium), oxygen and nitrogen, is no greater than 0.01 wt %, the α-sialon-based oxynitride phosphor has a median size of no greater than 8 μm in the particle size distribution curve, and the 90% size in the particle size distribution curve is no greater than 25 μm.

The present invention further relates to a process for producing an α-sialon-based oxynitride phosphor, characterized in that a mixed powder comprising a nitrogen-containing silane compound and/or amorphous silicon nitride powder having the oxygen content adjusted to 1–5 wt %, AlN and/or Al powder, an oxide of a metal M or a precursor substance which is converted to an oxide of a metal M upon thermal decomposition, and an oxide of a lanthanide metal Ln or a precursor substance which is converted to an oxide of a lanthanide metal Ln upon thermal decomposition, in a combination such that the metal impurity content is no greater than 0.01 wt % as calculated on the basis of the product being represented by the general formula: $M_xSi_{12-(m+n)}Al_{(m+n)}O_nN_{16-n}:Ln_y$ (wherein M is at least one metal selected from among Li, Ca, Mg, Y or lanthanide metals excluding La and Ce, Ln is at least one lanthanide metal selected from among Ce, Pr and La or at least one lanthanide metal selected from among Eu, Dy, Er, Tb and Yb), is fired at 1400–2000° C. in a nitrogen-containing inert gas atmosphere.

The invention still further relates to a process for producing an α-sialon-based oxynitride phosphor, characterized in that a mixture obtained by adding a pre-synthesized α-sialon powder represented by the general formula: $M_xSi_{12-(m+n)}Al_{(m+n)}O_nN_{16-n}$ or the general formula: $M_xSi_{12-(m+n)}Al_{(m+n)}O_nN_{16-n}:Ln_y$, to a mixed powder comprising a nitrogen-containing silane compound and/or amorphous silicon nitride powder having the oxygen content adjusted to 1–5 wt %, AlN and/or Al powder, an oxide of the metal M or a precursor substance which is converted to an oxide of the metal M upon thermal decomposition, and an oxide of the lanthanide metal Ln or a precursor substance which is converted to an oxide of the lanthanide metal Ln upon thermal decomposition, in a combination such that the metal impurity content is no greater than 0.01 wt % as calculated on the basis of the product being represented by the general formula: $M_xSi_{12-(m+n)}Al_{(m+n)}O_nN_{16-n}:Ln_y$ (wherein M is at least one type of metal selected from among Li, Ca, Mg, Y or lanthanide metals excluding La and Ce, Ln is at least one lanthanide metal selected from among Ce, Pr and La or at least one lanthanide metal selected from among Eu, Dy, Er, Tb and Yb), is fired at 1400–2000° C. in a nitrogen-containing inert gas atmosphere.

According to a preferred mode of the aforementioned invention relating to a process for producing an α-sialon-based oxynitride phosphor, the specific surface area of the nitrogen-containing silane compound and/or amorphous silicon nitride powder is 80–600 m$^2$/g, and/or the content of metal impurities other than constituent components of the final product and the content of carbon in the nitrogen-containing silane compound and/or amorphous silicon nitride powder are ≦0.01 wt % and ≦0.3 wt %, respectively.

The invention still further relates to a process for producing an oxynitride phosphor composed mainly of the aforementioned α-sialon, characterized in that the firing is carried out in a temperature range of 1600–2000° C. in a pressurized nitrogen gas atmosphere.

DETAILED DESCRIPTION OF THE INVENTION

Figure 1:
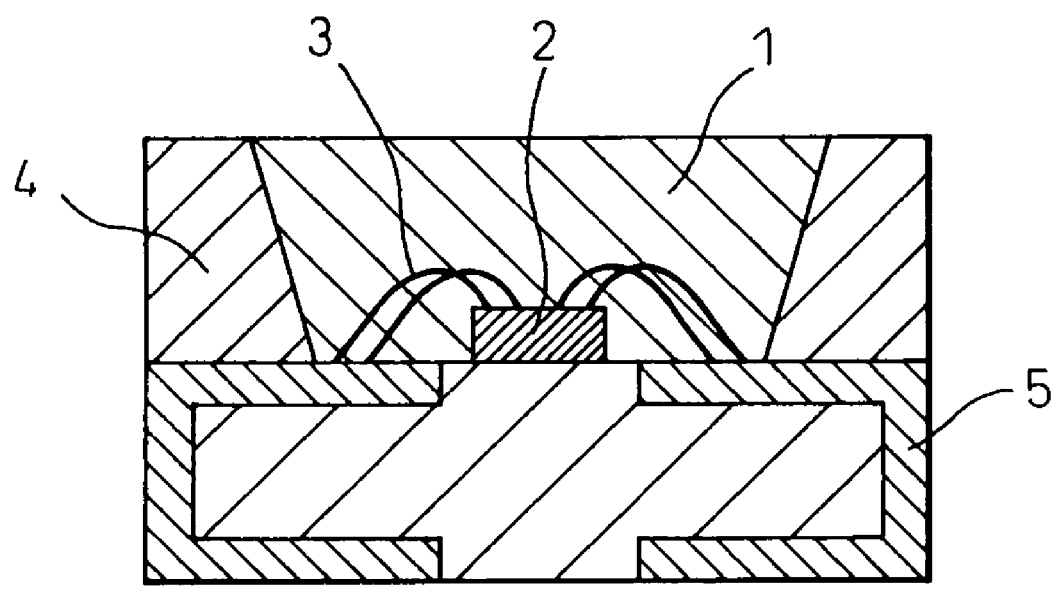
FIG. 1 is an illustration schematically showing the cross-sectional structure of a light emitting device employing an α-sialon oxynitride phosphor.

The present invention will now be explained more in detail.

In the oxynitride phosphor of the invention represented by the general formula: $M_xSi_{12-(m+n)}Al_{(m+n)}O_nN_{16-n}:Ln_y$, (wherein M is at least one metal selected from among Li, Ca, Mg, Y or lanthanide metals excluding La and Ce, Ln is at least one lanthanide metal selected from among Ce, Pr and La or at least one lanthanide metal selected from among Eu, Dy, Er, Tb and Yb), the metal M dissolving interstitially in the α-sialon as solid solution and the lanthanide metal Ln acting as the luminescence center dissolve to a maximum of two per large unit cell of α-sialon including the four formula weight of $(Si, Al)_3(N,O)_4$, and, therefore, from the standpoint of the solid solubility limit the values of the aforementioned general formula are preferably such that $0.3 \leq x+y<1.5$, $0<y<0.7$, $0.3 \leq m<4.5$, $0<n<2.25$, and $m=ax+by$ where a is the valence of the metal M and b is the valence of the lanthanide metal Ln. For example, when both the interstitial metals M and Ln are divalent, $0.6 \leq m<3.0$ and $0<n<1.5$, and when both the interstitial metals M and Ln are trivalent, $0.9 \leq m<4.5$ and $0<n<2.25$.

It was discovered that when a metal impurity is present in a phosphor, an energy level inherent to the metal impurity is formed, altering the spectrum and undesirably changing the color of the emitted light. Transition metals which show absorption in the visible light region are particularly undesirable. In the α-sialon-based oxynitride phosphor of the invention, the metal impurity content is reduced to 0.01 wt % or below, but it is more preferably reduced to 0.001 wt % or below.

It was also discovered that, because β-sialon will not dissolve the lanthanide metal acting as the luminescence center, the emitted light color and light emitting properties of the phosphor differ from α-sialon, and its presence is therefore not preferred. Oxynitride glass is also not preferred because the emitted light color and light emitting properties of the phosphor differ, but a small amount of a another heterogeneous thereof is unavoidable in the synthesis of α-sialon.

When the lanthanide metal Ln is selected from among Ce, Pr and La for the α-sialon-based oxynitride phosphor of the invention, the α-sialon content as measured by powder X-ray diffraction must be 75 wt % or greater, preferably 90 wt % or greater and even more preferably 95 wt % or greater, and when the lanthanide metal Ln is at least one lanthanide metal selected from among Eu, Dy, Er, Tb and Yb, the α-sialon content as measured by powder X-ray diffraction must be 90 wt % or greater, preferably 95 wt % or greater and even more preferably 98 wt % or greater.

According to the invention, the oxygen content of the nitrogen-containing silane compound and/or amorphous silicon nitride powder is first adjusted to 1–5 wt % and preferably 1.1–3 wt %, is then added with AlN and/or Al powder with oxides of the metal M and the lanthanide metal Ln acting as the luminescence center, and/or precursor substances which are converted to the oxides upon thermal decomposition, and is then fired at 1400–2000° C. in a nitrogen-containing inert gas atmosphere, as a process whereby formation of heterogeneous phase other than the α-sialon phase is inhibited in order to obtain an α-sialon-based oxynitride phosphor having an α-sialon content of 75 wt % or greater.

The α-sialon-based oxynitride phosphor has a median size of preferably no greater than 8 μm and more preferably 1–6 μm in the particle size distribution curve.

The 90% size ($d_{90}$) is preferably no greater than 25 μm and more preferably 2–20 μm. If the median size is larger than 8 μm, variations becomes large in the emitted light intensity and color when a light-transforming device is manufactured by mounting a molded mixture thereof with a translucent media such as acrylic resins, epoxy resins, or low-melting-point glass on a light emitting diode (LED). If the 90% size is greater than 25 μm, the distribution of coarse agglomerates will tend to result in considerable variation in emitted light intensity and color tone. In the α-sialon-based oxynitride phosphor of the invention, the dispersity $d_{90}/d_{10}$ as defined by the ratio of the 10% size ($d_{10}$) and the 90% size ($d_{90}$) in the particle size distribution curve is preferably no greater than 7 and more preferably no greater than 5. By controlling the $d_{90}/d_{10}$ ratio to no greater than 7, it is possible to obtain an α-sialon-based oxynitride phosphor with homogeneous, satisfactory light emission output and with the desired color tone, as well as light-transforming devices which employ it.

A low proportion of the dissolved lanthanide metal Ln acting as the luminescence center is not preferred, since this will not only lower the emitted light intensity of the phosphor but will also alter the emitted light color or light emitting properties.

The degree of interstitial distribution of the metal M and the lanthanide metal Ln in the α-sialon crystal lattice of the α-sialon represented by the general formula: $M_xSi_{12-(m+n)}Al_{(m+n)}O_nN_{16-n}:Ln_y$ is determined by comparing the (x+y) value as measured using a powder diffraction pattern-fitting RIETAN-2000 Rietveld analysis program for angular dispersion-type diffraction (for example, "Practical Powder X-Ray Diffraction—Introduction to Rietveld Method", edited by Japan Society for Analytical Chemistry, X-Ray Structure Analysis Research Group, by Nakai I., Izumi F., Asakura Publications (2002)), against the (x+y) value as measured by chemical compositional analysis of the product.

In the α-sialon-based oxynitride phosphor of the invention, the proportion of the added metal M and lanthanide metal Ln dissolved in the α-sialon crystal lattice may be as high as 80% or greater. In this α-silaon, at least 80% of the metal M and lanthanide metal Ln dissolve interstitially into the α-sialon crystal lattice of the α-sialon, while the remainder is present in the amorphous oxynitride glass phase.

The excess oxygen in the α-sialon powder of the invention is preferably no greater than 2.5 wt % and more preferably no greater than 2.0 wt % with respect to the theoretical oxygen content specified by the general formula: $M_xSi_{12-(m+n)}Al_{(m+n)}O_nN_{16-n}:Ln_y$.

The α-sialon powder of the invention may be obtained by using as the starting materials (a) a nitrogen-containing silane compound and/or amorphous silicon nitride powder, (b) metallic aluminum and/or aluminum nitride powder, (c) an oxide of a metal M which dissolves interstitially the lattice of α-sialon as a solid solution and/or a metal salt which produces the metal oxide upon thermal decomposition, (d) an oxide of a lanthanide metal Ln which acts as the luminescence center and/or a metal salt which produces the lanthanide metal oxide upon thermal decomposition, replacing all or a portion of the metal element M, and (e) an aluminum and/or silicon compound containing oxygen, and firing a mixture of the starting materials, combined so as to give the desired α-sialon composition, in a temperature range of 1400–1800° C. in a nitrogen-containing inert gas atmosphere.

The nitrogen-containing silane compound and/or amorphous silicon nitride powder used as the main starting material may be obtained by a known process, for example, a process wherein an Si—N—H based precursor compound, such as a silicon diimide produced by reacting a silicon halide such as silicon tetrachloride, silicon tetrabromide or silicon tetraiodide with ammonia in a gas phase or liquid phase, is thermally decomposed at 600–1200° C. in a nitrogen or ammonia gas atmosphere, or a process wherein a silicon halide and ammonia in a gaseous state are reacted at high temperature.

The mean particle size of the nitrogen-containing silane compound and/or amorphous silicon nitride powder obtained by the process described above is 0.005–0.05 μm. Such nitrogen-containing silane compound and/or amorphous silicon nitride powders are amorphous, exhibiting no distinct diffraction peak in ordinary X-ray diffraction. Depending on the heat treatment conditions it is possible to obtain a powder exhibiting a weak X-ray diffraction peak, and such powders are also included by the "nitrogen-containing silane compound and/or amorphous silicon nitride powder" of the invention.

According to the invention, the starting materials, i.e. a nitrogen-containing silane compound and/or amorphous silicon nitride powder, AlN and/or Al powder, an oxide of the metal M and/or a precursor substance which is converted to the oxide upon thermal decomposition, and an oxide of the lanthanide metal Ln and/or a precursor substance which is converted to the oxide upon thermal decomposition, are selected and combined in such a manner that the metal impurity content is no greater than 0.01 wt % as calculated on the basis of the product being represented by the general formula: $M_xSi_{12-(m+n)}Al_{(m+n)}O_nN_{16-n}:Ln_y$ and, therefore, using one high purity starting material will of course widen the range of selection for the other starting materials which can be used.

The nitrogen-containing silane compound and/or amorphous silicon nitride powder and the AlN and/or Al powder which are added in large amounts generally should have metal impurity contents of no greater than 0.01 wt %, preferably no greater than 0.005 wt % and more preferably no greater than 0.001 wt %. The oxide of the metal M and/or a precursor substance which is converted to the oxide upon thermal decomposition, and the oxide of the lanthanide metal Ln and/or a precursor substance which is converted to the oxide upon thermal decomposition, also preferably have metal impurity contents of no greater than 0.01 wt %, as the oxides.

Here, "metal impurity" refers to metal species other than Ga or the metal components added as constituent components of sialon.

The nitrogen-containing silane compound and/or amorphous silicon nitride powder used preferably has an oxygen content of 1–5 wt %. It more preferably has an oxygen content of 1–3 wt %. An oxygen content of less than 1 wt % is not preferred because it becomes very difficult to produce an α-sialon phase by reaction in the firing process, and production of a crystal phase residue of the starting materials or AlN polytypes such as 21R tends to occur. On the other hand, an oxygen content of greater than 5 wt %, while accelerating the α-sialon production reaction, will also increase the proportion of β-sialon or oxynitride glass produced.

The carbon content of the nitrogen-containing silane compound and/or amorphous silicon nitride powder is preferably no greater than 0.3 wt % and more preferably no greater than 0.15 wt %. Using a powder with a carbon content of greater than 0.3 wt % in the nitrogen-containing silane compound and/or amorphous silicon nitride powder results in formation of an energy level inherent to the produced oxynitride phosphor composed mainly of the α-sialon, thereby altering the spectrum and changing the color of the emitted light.

The nitrogen-containing silane compound and/or amorphous silicon nitride powder used preferably has a specific surface area of 80–600 m²/g. It more preferably has a specific surface area of 340–500 m²/g. If the specific surface area of the nitrogen-containing silane compound and/or amorphous silicon nitride powder is smaller than 340 m²/g, the amorphous particles tend to increase, the particle shapes deviate from equiaxed crystals, and the agglomerates are strengthened. Also, if the specific surface area of the nitrogen-containing silane compound and/or amorphous silicon nitride powder is smaller than 80 m²/g, the particles tend to be coarser than 30 nm, the activity of the sialon formation reaction decreases, and the product results in an large amount of an α-type silicon nitride phase and β-type silicon nitride phase in which the interstitial metal does not dissolve. If the specific surface area is greater than 600 m²/g, the particle sizes of the primary particles become too fine, excess agglomerates are produced, the miscibility with the AlN, metal M, lanthanide metal Ln, etc. is notably degraded, and the α-sialon formation reaction is inhibited. While the reason for this is not fully understood, it is known that considerable coalescence occurs between the α-sialon particles produced after firing, resulting in greater coarseness, and making it difficult to obtain α-sialon-based oxynitride phosphor powder having the desired particle distribution.

As aluminum sources there may be used metallic aluminum powder and aluminum nitride powder, either alone or in combination. Aluminum nitride powder may be conventional aluminum nitride powder having an oxygen content of 0.1–8 wt % and a specific surface area of 1–100 m²/g.

As metal salts which produce oxides of the metal M or the lanthanide metal Ln upon thermal decomposition there may be mentioned various carbonic acid salts, oxalic acid salts, citric acid salts, basic carbonic acid salts, hydroxides and the like.

There are no particular restrictions on the method of mixing the aforementioned starting materials, and any known method may be employed, such as a dry mixing method or a method of wet mixing in an inert solvent which is substantially unreactive with the starting components and then removing the solvent. As mixing apparatuses there may be suitably used V-mixers, rocking mixers, ball mills, vibrating mills, medium stirring mills and the like. However, because nitrogen-containing silane compound and/or amorphous silicon nitride powders are highly sensitive to moisture and humidity, the mixing of the starting materials must be carried out in a controlled inert gas atmosphere.

The starting material mixture is fired at 1400–1800° C. and preferably 1500–1800° C. in a nitrogen-containing inert gas atmosphere at 1 atmosphere pressure, to obtain the desired α-sialon powder. If the firing temperature is below 1400° C., an impracticably long period of heating will be required for production of the desired α-sialon powder, and the proportion of α-sialon phase produced in the powder will also be reduced. A firing temperature of above 1800° C. will create an undesirable situation with sublimation and decomposition of the silicon nitride and sialon, and formation of free silicon.

The starting material powder mixture may be fired in a temperature range of 1600–2000° C. and preferably 1600–1900° C. in a pressurized nitrogen gas atmosphere. In this case, the nitrogen gas pressurization suppresses sublimating decomposition of silicon nitride and sialon at high temperature, so that the desired α-sialon-based oxynitride phosphor can be obtained in a shorter period of time. The firing temperature may be raised if the nitrogen gas pressure is increased, and for example, firing may be conducted at 1600–1850° C. under nitrogen gas pressure of 5 atmospheric pressure, and at 1600–2000° C. under nitrogen gas pressure of 10 atmospheric pressure.

There are no particular restrictions on the heating furnace used for firing of the powder mixture, and for example, there may be used a high-frequency induction heating or resistance heating batch-type electric furnace, a rotary kiln, a fluidizing firing furnace, a pusher-type electric furnace, or the like.

Since metals with atomic radii smaller than 0.1 nm such as Li, Ca, Mg, Y, Eu, Dy, Er, Tb and Yb readily dissolve interstitially in the sialon crystal lattice as solid solution by the aforementioned processes, it is possible to easily obtain an α-sialon-based oxynitride phosphor with an α-sialon content of 90 wt % or greater.

In contrast, Ce, Pr and La having ionic radii larger than 0.1 nm do not readily dissolve in the α-sialon crystal lattice as simple elements. Including the aforementioned elements having ionic radii of less than 0.1 nm makes it possible to produce α-sialon with Ce, Pr and La interstitially dissolved therein, but in order to obtain an oxynitride phosphor with an α-sialon percentage of 75 wt % or greater having Ce, Pr and La dissolved therein at the desired concentration, it is necessary to use a precise starting material mixture and a prolonged firing procedure, which are not suitable for industrial sialon powder production.

The process of the invention for dissolving Ce, Pr and La comprises adding pre-synthesized α-sialon powder represented by the general formula: $M_xSi_{12-(m+n)}Al_{(m+n)}O_nN_{16-n}$ or the general formula: $M_xSi_{12-(m+n)}Al_{(m+n)}O_nN_{16-n}:Ln_y$ to the aforementioned starting material composition. Adding such α-sialon particles as growth nuclei for the α-sialon phase can easily yield an oxynitride phosphor with an α-sialon content of 75 wt % or greater, even for Ce, Pr and La which have atomic radii exceeding 0.1 nm.

The methods mentioned above for the nitrogen-containing silane compound and/or amorphous silicon nitride powder as the starting materials may be directly employed for mixing and firing of the starting materials in this case as well.

The production process of the invention wherein α-sialon particles are added as growth nuclei for the α-sialon phase is particularly effective for Ce, Pr and La having ionic radii of larger than 0.1 nm, but it is also useful for metals with ionic radii smaller than 0.1 nm, such as Li, Ca, Mg, Y, Eu, Dy, Er, Tb and Yb.

The rare earth element-activated α-sialon-based oxynitride phosphor of the present invention is combined with a transparent medium such as acrylic resin, epoxy resin or low-melting-point glass by a known method to produce a thin coating-molded layer, and the surface of a light emitting diode is then covered with this thin molded layer for use as a light-transforming element.

An example of such a light-transforming element or light emitting device is shown in FIG. 1. In FIG. 1, 1 is a transparent medium made of molded low-melting-point glass or a molded resin containing the phosphor, and it covers the surface of a blue LED chip 2. Numeral 3 indicates a metal wire, 4 a molded article package and 5 a lead electrode. In this light-transforming element or light emitting device, light emitted from the blue LED chip 2 is converted to white light by the phosphor 1 of the invention distributed in the transparent medium 1, and is therefore emitted outwardly as white light.

EXAMPLES

The present invention will now be explained in further detail through the following concrete examples.

Examples 1–8

Silicon diimide with a specific surface area of 750 m$^2$/g obtained by reaction of silicon tetrachloride and ammonia at below room temperature was thermally decomposed at 700–1200° C. to obtain nitrogen-containing silane compounds and/or amorphous silicon nitride powders with specific surface areas of 60–460 m$^2$/g. Each material was subjected to a known process for improving the condition of chafing between the powder and metal in the reactor material and powder handling machinery, in order to reduce the metal impurities contaminating the nitrogen-containing silane compound and/or amorphous silicon nitride powder to under 10 ppm. Also, by varying the oxygen concentration in the nitrogen gas circulating in the heating furnace to within the range of 20–1000 ppm, the oxygen content of the nitrogen-containing silane compound and/or amorphous silicon nitride powder was adjusted to the values shown in Table 1.

For Example 8 there was used nitrogen-containing silane compound and/or amorphous silicon nitride powder having a low specific surface area of 64 m$^2$/g.

The aluminum nitride (AlN) powder used in all of the examples was AlN powder having an oxygen content of 1.0 wt %, a carbon content of 0.06 wt %, a specific surface area of 3.8 m$^2$/g and a content of metal impurities other than Al, Si and Ca of less than 10 ppm.

For Examples 1 to 4, the nitrogen-containing silane compound and/or amorphous silicon nitride powder, aluminum nitride powder, and powder of an oxide of a modifying metal element M or an oxide of a rare earth element Ln were combined in the mixing proportions shown in Table 1 using a vibrating mill for 1 hour in a nitrogen gas atmosphere. The powder mixture was molded in a nitrogen-purged glove box, to obtain a molded article with a bulk density of 0.70 g/cm$^3$. The obtained molded article was packed into a silicon carbide crucible and set in a resistance heating electric furnace, and then the temperature was raised at a schedule from room temperature to 1200° C. over a period of 2 hours, from 1200° C. to 1440° C. over a period of 4 hours and from 1440° C. to 1630° C. over a period of 2 hours, in a nitrogen gas atmosphere, and then was held at the same temperature for one hour for crystallization to obtain α-sialon powders composed mainly of Ca-α-sialon, Mg-α-sialon, Y-α-sialon and Dy-α-sialon.

For Examples 5 to 8, the nitrogen-containing silane compound and/or amorphous silicon nitride powder and the aluminum nitride powder used as starting materials were first confirmed to have the prescribed oxygen contents and, then, the nitrogen-containing silane compound and/or amorphous silicon nitride powder, aluminum nitride powder, powder of an oxide of a modifying metal element M or an oxide of a rare earth element Ln and the Ca-α-sialon powder prepared in Example 1 were combined in the mixing proportions shown in Table 1 using a vibrating mill for 1 hour in a nitrogen gas atmosphere. The powder mixture was molded in a nitrogen-purged glove box, to obtain a molded article with a bulk density of 0.70 g/cm$^3$. The obtained molded article was packed into a silicon carbide crucible and set in a resistance heating electric furnace, and then the temperature was raised at a schedule from room temperature to 1200° C. over a period of 2 hours, from 1200° C. to 1440° C. over a period of 4 hours and from 1440° C. to the prescribed temperature over a period of 2 hours, in a nitrogen gas atmosphere, after which it was held at the same temperature for one hour for crystallization to obtain α-sialon powder.

The crystal phase of the obtained α-sialon powder was identified by powder X-ray diffraction, while the proportion of α-sialon produced and the solid dissolutions of the modifying metal element M or rare earth element Ln were determined by Rietveld analysis. The solid dissolutions of the modifying metal element M or rare earth element Ln are listed as X1 in Table 1, using the values of X in the general formula: $M_xSi_{12-(m+n)}Al_{(m+n)}O_nN_{16-n}$ or $Ln_xSi_{12-(m+n)}Al_{(m+n)}O_nN_{16-n}$.

After next dissolving the powder product by the pressurized hydrofluoric acid decomposition method, the chemical composition was analyzed by ICP. The nitrogen content of the powder product was determined by alkali fusion analysis and the oxygen content was determined by inert gas fusion analysis (LECO method). The specific surface area was measured by the BET single-point method. The particle shapes were examined with a scanning electron microscope.

The sialon powder obtained in each of the examples had a mean particle size evenly distributed in the range of 2–7 µm, and the product was confirmed to be α-sialon based on the aforementioned X-ray diffraction and compositional analysis.

The measured values for the crystal phase, chemical composition, specific surface area, particle shapes, etc. of the obtained α-sialon powders are shown in Table 2.

Example 9

In this example, the nitrogen gas pressure and temperature for firing were changed. α-sialon powder was obtained in approximately the same manner as Example 5, except that the temperature was raised at a schedule from room temperature to 1200° C. over a period of 2 hours, from 1200° C. to 1440° C. over a period of 2 hours and from 1440° C. to 1800° C. over a period of 3.6 hours, in a pressurized nitrogen gas atmosphere at 10 atmospheres, and then was held at the same temperature for one hour for crystallization.

The specifications and mixing ratios of the starting materials are shown in Table 1, and the results of measuring the crystal phase, chemical composition, specific surface area, particle shapes, etc. of the α-sialon powders obtained in the same manner as in Examples 5 to 8 are shown in Table 2.

Comparative Examples 1–5

First, silicon diimide with a specific surface area of 800 m$^2$/g was thermally decomposed at 500–1100° C. to obtain nitrogen-containing silane compounds and/or amorphous silicon nitride powders with specific surface areas of 150–550 m$^2$/g. A known process for altering the condition of chafing between the powder and metal in the reactor material and powder handling machinery was employed to obtain nitrogen-containing silane compounds and/or amorphous silicon nitride powders with different contaminating metal impurity contents. Also, the oxygen concentration in the nitrogen gas circulating in the heating furnace was varied, within the range of 5–3000 ppm, to obtain nitrogen-containing silane compounds and/or amorphous silicon nitride powders with low oxygen contents, or nitrogen-containing silane compounds and/or amorphous silicon nitride powders with high oxygen contents. These nitrogen-containing silane compounds and/or amorphous silicon nitride powders were used for Comparative Examples 1 to 5, and the methods for preparing the α-sialon powders and the methods for measuring the properties of the α-sialon powders were approximately the same as in Examples 5 to 8. The specifications and mixing ratios of the starting materials are shown in Table 1, and the results of measuring the crystal phase, chemical composition, specific surface area, particle shapes, etc. of the α-sialon powders obtained in the same manner as in Examples 5 to 9 are shown in Table 2.

Comparative Example 4 is an example of a low oxygen content in the nitrogen-containing silane compound and/or amorphous silicon nitride powder, while Comparative Example 5 is an example of a high oxygen content.

Comparative Example 3 is an example wherein the firing conditions were changed to 1350° C. In this case, the α-sialon powder was obtained by temperature increase and firing at the same temperature increase rate as in Example 5, but with a different final temperature.

Comparative Examples 3 to 5 are examples using different previously prepared sialon powders. The Ca-α-sialon powder prepared in Example 1 was added to obtain α-sialon powder by approximately the same method as in Example 5.

Comparative Examples 6–8

Comparative Examples 6 to 8 are examples of using crystalline silicon nitride powder with a specific surface area of about 10 m$^2$/g as the starting material. Mixing of the starting materials was carried out using a wet-type ball mill with ethanol as the solvent. The starting materials had different metal impurity contents, but exceeded 150 ppm in Comparative Examples 6 and 8.

The bulk density of the molded powder mixture was increased to a value of about 1.2 g/cm$^3$.

Comparative Examples 6 and 8 are examples of adding the Ca-α-sialon powder obtained in Example 1 to the starting materials in the same manner as Examples 5–8 and Comparative Examples 3 to 5.

Examples 10–23 and Comparative Examples 9–15 The following Examples 10 to 23 and Comparative Examples 9 to 15 are examples for α-sialon powder represented by the general formula: $M_xSi_{12-(m+n)}Al_{(m+n)}O_nN_{16-n}$:$Ln_yDy_z$ containing Dy as a co-activator, unless otherwise specified. The method for preparing the α-sialon powders and the methods for measuring the properties of the produced α-sialon powders were the same as in Example 5, except for the modifications listed for each example. The conditions for preparation of the α-sialon powders are shown in Table 3 and the values of the properties of the produced α-sialon powders are summarized in Table 4.

Examples 10 and 11

α-sialon powders were obtained in the same manner as Example 5, except that three different metal oxides were used as the starting material, a modifying metal M oxide (MO), a lanthanide metal Ln oxide ($Ln_xO_y$) as an activator and dysprosium oxide ($Dy_2O_3$) as a co-activator, and the nitrogen-containing silane compound and/or amorphous silicon nitride powder, aluminum nitride powder and the three different metal oxide powders infiltrating in solid solution were mixed for one hour with a vibrating mill in a nitrogen gas atmosphere, in the mixing proportions shown in Table 3. The properties of the obtained α-sialon powders were measured in the same manner as Example 5.

Example 10 is an example of firing using a nitrogen-containing silane compound and/or amorphous silicon nitride powder with an increased oxygen content.

α-sialon powder was obtained by using a nitrogen-containing silane compound and/or amorphous silicon nitride powder having an oxygen content of 3 wt % and a specific surface area of 380 m$^2$/g or greater, with the oxygen concentration of the nitrogen gas circulating in the heating furnace adjusted up to 1300 ppm, and firing a mixture thereof with aluminum nitride powder and the three different metal oxide powders infiltrating in solid solution using the same temperature increase profile as in Example 8.

Example 11 is an example of using a nitrogen-containing silane compound and/or amorphous silicon nitride powder with a slightly higher metal impurity content than Example 10.

Examples 12 to 23 are examples of adding Ca-α-sialon powder (Example 1), Mg-α-sialon powder (Example 2), Y-α-sialon powder (Example 3) and Dy-α-sialon powder (Example 4), obtained in Examples 1 to 4, to one starting material.

Example 18 is an example of using a nitrogen-containing silane compound and/or an amorphous silicon nitride powder with a specific surface area of 620 m$^2$/g, obtained by 400° C. thermal decomposition of silicon diimide with a specific surface area of 800 m$^2$/g.

Figure 2:
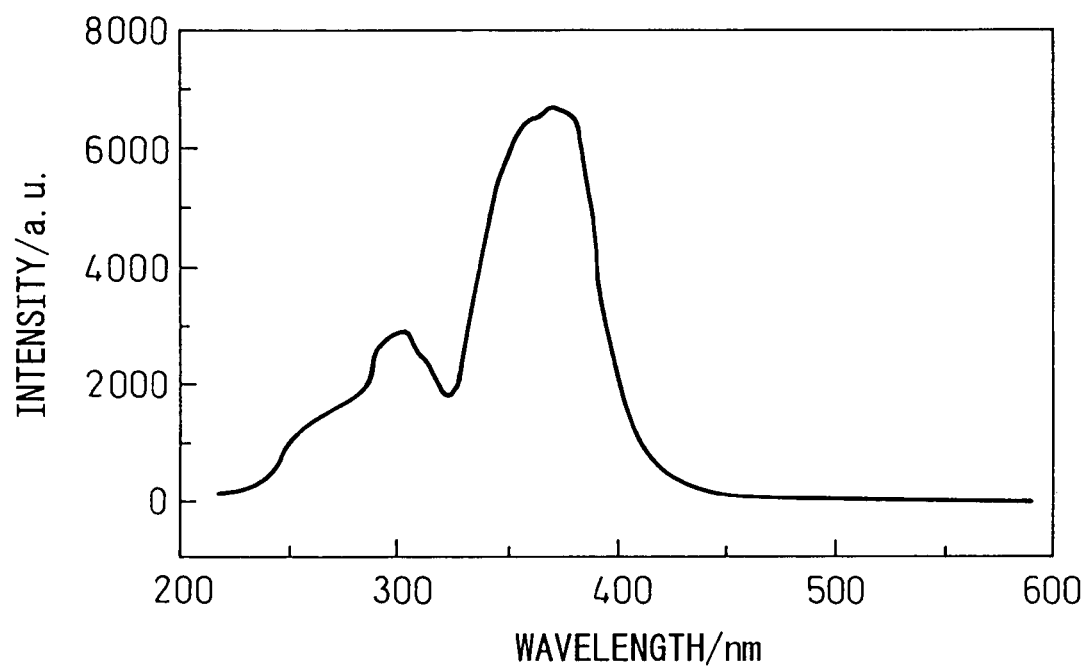
FIG. 2 is a chart showing the excitation spectrum for a Ca-α-sialon phosphor activated with Ce$^{2+}$ ion.
Figure 3:
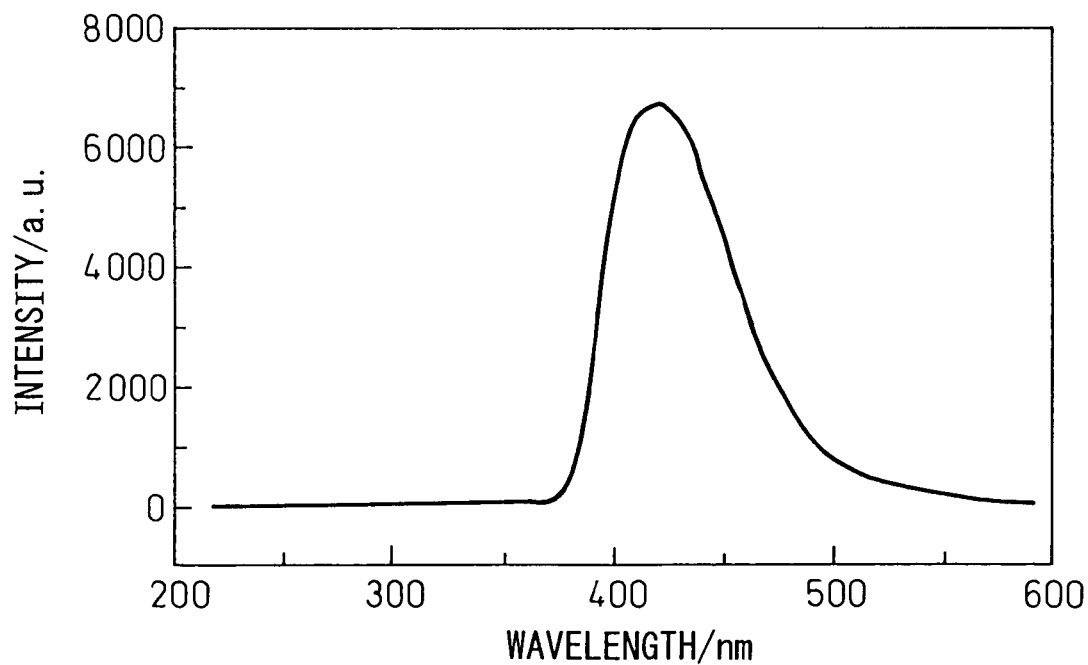
FIG. 3 is a chart showing the emission spectrum for a Ca-α-sialon phosphor activated with Ce$^{2+}$ ion.

A Nihon Bunko FP-777 fluorescent spectrophotometer was used to measure the excitation spectrum of the obtained α-sialon powder for light with a wavelength of 420 nm and the emission spectrum for excitation light with a wavelength of 355 nm. FIG. 2 and FIG. 3 show the excitation spectrum and emission spectrum charts for the α-sialon powder having the compositional formula $Ca_{0.66}Y_{0.03}Ce_{0.10}Dy_{0.03}Si_{9.3}Al_{2.7}O_{1.2}N_{14.8}$ obtained in Example 20.

Examples 21 and 22 are examples of preparing α-sialon powders by adding the Mg-α-sialon powder prepared in Example 2 (Example 21) and the Ce-α-sialon powder prepared in Example 7 (Example 22) to one starting material, and using a temperature increase profile of from room temperature to 1200° C. over a period of 2 hours, from 1200° C. to 1440° C. over a period of 2 hours and from 1440° C. to 1800° C. over a period of 3.6 hours, in a pressurized nitrogen gas atmosphere of 10 atmospheric pressure, and then holding at the same temperature for one hour.

Example 22 is an example of using a nitrogen-containing silane compound and/or amorphous silicon nitride powder with a high carbon content as the starting material.

Example 23 is an example of preparing α-sialon powder using as the starting material a nitrogen-containing silane compound and/or amorphous silicon nitride powder having a specific surface area of 650 m$^2$/g obtained by 400° C. thermal decomposition of silicon diimide with a specific surface area of 820 m$^2$/g, and firing in a pressurized nitrogen gas atmosphere of 10 atmospheric pressure with the same firing profile as in Example 21, except that the final firing temperature was increased to 1920° C.

Comparative Examples 9 to 13 are examples of using nitrogen-containing silane compounds and/or amorphous silicon nitride powders with high metal impurity contents of 150 ppm or greater as starting materials. In Comparative Example 11 the oxygen concentration of the nitrogen gas circulating in the heating furnace was 3000 ppm, and therefore the oxygen content of the nitrogen-containing silane compound and/or amorphous silicon nitride powder is also higher. Comparative Example 16 is an example of using a nitrogen-containing silane compound and/or amorphous silicon nitride powder with a low specific surface area of 60 m$^2$/g.

Comparative Examples 14 and 15 are examples of using as the starting material a crystalline silicon nitride powder with a high metal impurity content of about 150 ppm and with a specific surface area of about 10 m$^2$/g. The starting materials were mixed using a wet-type ball mill with ethanol as the solvent.

The properties of the phosphors were evaluated in the following manner.

The translucent material used was low-melting-point glass, with a melting point of 500° C. The α-sialon-based oxynitride phosphor obtained as an example or comparative example was combined with the low-melting-point glass in a weight ratio of 5:100 to obtain a phosphor-dispersed mixture. The mixture was molded with a heating press and mounted on an ultraviolet emitting LED as the light source for utilization as a fluorescent light emitting layer.

As the light source there was prepared a ZnO/Mg$_x$Zn$_{(1-x)}$O-based ultraviolet emitting LED having a light emitting layer with a main emission peak of 350–380 nm. The ultraviolet emitting LED 2 was mechanically fixed to the recess of the molded package 4 shown in FIG. 3. A 35 μm gold wire was used for wire bonding electrical connection between each electrode of the ultraviolet emitting LED and each lead electrode 5.

The molded low-melting-point glass containing the α-sialon-based oxynitride phosphor was fixed into the recess of the molded package 4 on which the ultraviolet emitting LED 2 was situated to obtain a blue emitting LED having the light source covered with a fluorescent layer.

The emission properties of 500 blue emitting LEDs were measured, and the mean values and standard deviation for the emitted light intensity were calculated to determine the variation in properties between elements. The variation in color was also examined.

The results are shown in Table 5.

TABLE 1

| | Starting material types and properties | | | | | | | | | Starting material composition (g) | | | | | |
|---|---|---|---|---|---|---|---|---|---|---|---|---|---|---|---|
| | Amor.Si$_3$N$_4$ | | | | | AlN | | Interstitially dissolved metal oxides | | | | | | | Pre-syn-thesized α-sialon |
| | Carbon content (wt %) | Oxygen content (wt %) | Metal impurity content (ppm) | | | Specific surface area (m$^2$/g) | Oxygen content (wt %) | Specific surface area (m$^2$/g) | Modifying metal M | Activator Ln | Cryst. Si$_3$N$_4$ | Amor. Si$_3$N$_4$ | AlN | Metal oxide MO | Lanthanide oxide Ln$_x$O$_y$ | |
| | | | Cr | Fe | Ni | | | | | | | | | | | |
| Example 1 | 0.07 | 1.16 | <1 | 3 | <1 | 360 | 1.0 | 3.8 | CaO | CeO$_2$ | 0 | 464.9 | 113.0 | 47.9 | 5.2 | — |
| Example 2 | 0.08 | 1.64 | <1 | 4 | <1 | 180 | 1.0 | 3.8 | MgO | CeO$_2$ | 0 | 468.4 | 113.9 | 34.5 | 5.2 | — |
| Example 3 | 0.06 | 2.26 | <1 | 3 | <1 | 380 | 1.0 | 3.8 | Y$_2$O$_3$ | CeO$_2$ | 0 | 473.1 | 115.2 | 64.4 | 5.2 | — |
| Example 4 | 0.10 | 2.28 | <1 | 4 | <1 | 460 | 1.0 | 3.8 | Dy$_2$O$_3$ | CeO$_2$ | 0 | 473.2 | 115.2 | 106.3 | 5.2 | — |
| Example 5 | 0.06 | 1.54 | <1 | 4 | <1 | 430 | 1.0 | 3.8 | CaO | CeO$_2$ | 0 | 458.8 | 106.3 | — | 96.6 | 39.5 |
| Example 6 | 0.11 | 2.44 | <1 | 4 | <1 | 180 | 1.0 | 3.8 | CaO | CeO$_2$ | 0 | 464.3 | 107.6 | — | 96.6 | 39.5 |
| Example 7 | 0.09 | 2.23 | <1 | 4 | <1 | 460 | 1.0 | 3.8 | CaO | CeO$_2$ | 0 | 442.1 | 107.6 | — | 96.6 | 39.5 |
| Example 8 | 0.07 | 1.54 | <1 | 4 | <1 | 64 | 1.0 | 3.8 | CaO | CeO$_2$ | 0 | 458.8 | 106.3 | — | 96.6 | 39.5 |
| Example 9 | 0.11 | 2.09 | <1 | 4 | <1 | 360 | 1.0 | 3.8 | CaO | Pr$_6$O$_{11}$ | 0 | 441.2 | 107.4 | — | 95.5 | 39.5 |
| Comp. Ex. 1 | 0.16 | 1.96 | 20 | 230 | 45 | 460 | 1.0 | 3.8 | CaO | Pr$_6$O$_{11}$ | 0 | 470.8 | 114.6 | 2.5 | 97.0 | — |
| Comp. Ex. 2 | 0.18 | 2.23 | 20 | 230 | 45 | 430 | 1.0 | 3.8 | CaO | CeO$_2$ | 0 | 472.9 | 115.1 | 2.5 | 98.1 | — |
| Comp. Ex. 3 | 0.17 | 1.56 | 4 | 38 | 5 | 430 | 1.0 | 3.8 | CaO | CeO$_2$ | 0 | 458.9 | 106.4 | — | 96.6 | 39.4 |
| Comp. Ex. 4 | 0.34 | 0.91 | 4 | 40 | 7 | 150 | 1.0 | 3.8 | CaO | CeO$_2$ | 0 | 436.6 | 106.1 | — | 97.1 | 37.0 |
| Comp. Ex. 5 | 0.17 | 5.50 | 5 | 41 | 6 | 550 | 1.0 | 3.8 | CaO | CeO$_2$ | 0 | 469.1 | 114.7 | — | 97.1 | 37.0 |
| Comp. Ex. 6 | 0.09 | 1.99 | 18 | 200 | 38 | 10.2 | 1.0 | 3.8 | CaO | Pr$_6$O$_{11}$ | 420.2 | 0 | 107.4 | — | 95.5 | 39.5 |
| Comp. Ex. 7 | 0.08 | 2.18 | 3 | 40 | 6 | 10.4 | 1.0 | 3.8 | CaO | CeO$_2$ | 450.7 | 0 | 115.2 | 2.5 | 98.1 | — |
| Comp. Ex. 8 | 0.09 | 2.13 | 13 | 150 | 29 | 10.1 | 1.0 | 3.8 | CaO | CeO$_2$ | 421.1 | 0 | 107.6 | — | 96.6 | 39.5 |

Cryst.Si$_3$N$_4$: Crystalline silicon nitride
Amor.Si$_3$N$_4$: Amorphous silicon nitride

TABLE 2

| | Firing conditions | | X-ray diffraction | | | Product composition and excess oxygen content | | | | | | | | |
|---|---|---|---|---|---|---|---|---|---|---|---|---|---|---|
| | | | | | | Product composition (wt %) | | | | | | | | Powder properties |
| | Nitrogen gas pressure (Atm) | Maximum holding temperature (° C.) | Produced α-sialon phase (wt %) | X1 value by Rietveld analysis | Interstitial solid solution ratio X1/X2 | X2 value based on chemical composition | Si | Al | O | N | Modifying metal oxide M | Activating lanthanide metal Ln | Excess oxygen (wt %) | Specific surface area (m²/g) | Particle shapes |
| Example 1 | 1.0 | 1630 | 96 | 0.84 | 0.93 | 0.9 | 43.7 | 12.2 | 3.2 | 34.9 | 5.7 | 0.6 | 0.8 | 1.1 | equiaxial crystals |
| Example 2 | 1.0 | 1620 | 93 | 0.80 | 0.89 | 0.9 | 44.7 | 12.5 | 3.6 | 35.5 | 3.5 | 0.6 | 1.2 | 2.1 | slightly amorphous |
| Example 3 | 1.0 | 1630 | 95 | 0.52 | 0.87 | 0.6 | 42.4 | 11.9 | 3.8 | 33.5 | 8.0 | 0.6 | 1.6 | 1.7 | equiaxial crystals |
| Example 4 | 1.0 | 1630 | 95 | 0.52 | 0.86 | 0.6 | 39.6 | 11.1 | 3.6 | 31.3 | 13.7 | 0.6 | 1.5 | 1.3 | equiaxial crystals |
| Example 5 | 1.0 | 1630 | 92 | 0.57 | 0.92 | 0.62 | 40.6 | 11.4 | 3.3 | 32.2 | 0.3 | 12.1 | 1.1 | 2.0 | equiaxial crystals |
| Example 6 | 1.0 | 1630 | 94 | 0.52 | 0.85 | 0.62 | 40.6 | 11.4 | 3.7 | 32.0 | 0.3 | 12.0 | 1.7 | 1.4 | slightly amorphous |
| Example 7 | 1.0 | 1630 | 97 | 0.55 | 0.88 | 0.62 | 40.4 | 11.4 | 3.6 | 31.9 | 0.4 | 11.9 | 1.5 | 1.6 | equiaxial crystals |
| Example 8 | 1.0 | 1650 | 86 | 0.52 | 0.84 | 0.62 | 40.6 | 11.4 | 3.3 | 32.2 | 0.3 | 12.1 | 1.1 | 1.8 | slightly amorphous |
| Example 9 | 10 | 1800 | 96 | 0.55 | 0.89 | 0.62 | 40.4 | 11.4 | 3.5 | 32.0 | 0.4 | 11.9 | 1.4 | 0.9 | equiaxial crystals |
| Comp. Ex. 1 | 1.0 | 1630 | 13 | — | — | 0.62 | 40.4 | 11.4 | 3.5 | 32.0 | 0.3 | 12.1 | 1.4 | 3.4 | equiaxial crystals |
| Comp. Ex. 2 | 1.0 | 1630 | 17 | — | — | 0.62 | 40.4 | 11.4 | 3.7 | 31.9 | 0.3 | 12.0 | 1.6 | 3.2 | equiaxial crystals |
| Comp. Ex. 3 | 1.0 | 1350 | 30 | 0.32 | 0.52 | 0.62 | 40.6 | 11.4 | 3.3 | 32.2 | 0.3 | 12.1 | 1.1 | 6.5 | equiaxial crystals |
| Comp. Ex. 4 | 1.0 | 1630 | 65 | 0.48 | 0.77 | 0.62 | 40.5 | 11.3 | 3.0 | 32.3 | 0.4 | 12.0 | 0.7 | 2.2 | slightly amorphous |
| Comp. Ex. 5 | 1.0 | 1630 | 48 | 0.33 | 0.54 | 0.62 | 40.2 | 11.4 | 5.9 | 30.4 | 0.4 | 11.3 | 4.1 | 1.2 | equiaxial crystals |
| Comp. Ex. 6 | 1.0 | 1630 | 58 | 0.35 | 0.56 | 0.62 | 40.4 | 11.4 | 3.6 | 31.9 | 0.4 | 12.3 | 1.5 | 1.6 | equiaxial crystals |
| Comp. Ex. 7 | 1.0 | 1630 | <5 | — | — | 0.62 | 39.6 | 11.1 | 3.7 | 31.2 | 0.3 | 13.7 | 1.6 | 1.3 | equiaxial crystals |
| Comp. Ex. 8 | 1.0 | 1630 | 65 | 0.35 | 0.56 | 0.62 | 40.4 | 11.4 | 3.7 | 31.9 | 0.4 | 12.2 | 1.6 | 1.4 | equiaxial crystals |

TABLE 3

| | Starting material types and properties | | | | | | | | | | |
|---|---|---|---|---|---|---|---|---|---|---|---|
| | Amor.$Si_3N_4$ | | | | | AlN | | Interstitially dissolved metal oxide in solid solution | | | Pre-synthesized α-sialon |
| | Carbon content (wt %) | Oxygen content (wt %) | Metal impurity content (ppm) Cr | Fe | Ni | Specific surface area (m²/g) | Oxygen content (wt %) | Specific surface area (m²/g) | Modifying metal M | Activator Ln | Co-activator Dy | |
| Example 10 | 0.15 | 3.06 | <1 | 6 | <1 | 380 | 1.0 | 3.8 | CaO | $Pr_6O_{11}$ | $Dy_2O_3$ | — |
| Example 11 | 0.17 | 1.91 | 3 | 40 | 7 | 460 | 1.0 | 3.8 | CaO | $CeO_2$ | $Dy_2O_3$ | — |
| Example 12 | 0.10 | 1.44 | <1 | 3 | <1 | 180 | 1.0 | 3.8 | CaO | $Pr_6O_{11}$ | — | Dy-sialon |
| Example 13 | 0.10 | 1.63 | <1 | 3 | <1 | 400 | 1.0 | 3.8 | CaO | $Pr_6O_{11}$ | $Dy_2O_3$ | Ca-sialon |
| Example 14 | 0.10 | 1.63 | <1 | 3 | <1 | 400 | 1.0 | 3.8 | CaO | $Pr_6O_{11}$ | $Dy_2O_3$ | Ca-sialon |
| Example 15 | 0.10 | 1.82 | <1 | 3 | <1 | 400 | 1.0 | 3.8 | MgO | $Pr_6O_{11}$ | $Dy_2O_3$ | Mg-sialon |
| Example 16 | 0.09 | 1.59 | 3 | 40 | 7 | 460 | 1.0 | 3.8 | CaO | $CeO_2$ | — | Dy-sialon |
| Example 17 | 0.08 | 1.32 | <1 | 3 | <1 | 460 | 1.0 | 3.8 | CaO | $CeO_2$ | $Dy_2O_3$ | Ca-sialon |
| Example 18 | 0.07 | 1.61 | <1 | 3 | <1 | 620 | 1.0 | 3.8 | CaO | $CeO_2$ | — | Dy-sialon |

TABLE 3-continued

| | | | | | | | | | | | | |
|---|---|---|---|---|---|---|---|---|---|---|---|---|
| Example 19 | 0.09 | 2.04 | <1 | 4 | <1 | 430 | 1.0 | 3.8 | CaO | CeO$_2$ | Dy$_2$O$_3$ | Ca-sialon |
| Example 20 | 0.09 | 1.47 | <1 | 4 | <1 | 430 | 1.0 | 3.8 | CaO | CeO$_2$ | Dy$_2$O$_3$ | Y-sialon |
| Example 21 | 0.09 | 1.67 | <1 | 4 | <1 | 430 | 1.0 | 3.8 | MgO | CeO$_2$ | Dy$_2$O$_3$ | Mg-sialon |
| Example 22 | 0.36 | 1.89 | <1 | 4 | <1 | 430 | 1.0 | 3.8 | CaO | CeO$_2$ | Dy$_2$O$_3$ | Ce-sialon |
| Example 23 | 0.08 | 1.96 | <1 | 4 | <1 | 650 | 1.0 | 3.8 | CaO | CeO$_2$ | — | Dy-sialon |
| Comp. Ex. 9 | 0.15 | 1.89 | 18 | 200 | 38 | 320 | 1.0 | 3.8 | CaO | Pr$_6$O$_{11}$ | Dy$_2$O$_3$ | — |
| Comp. Ex. 10 | 0.15 | 1.91 | 23 | 250 | 46 | 270 | 1.0 | 3.8 | CaO | CeO$_2$ | Dy$_2$O$_3$ | — |
| Comp. Ex. 11 | 0.15 | 5.21 | 17 | 200 | 37 | 430 | 1.0 | 3.8 | CaO | Pr$_6$O$_{11}$ | Dy$_2$O$_3$ | Ca-sialon |
| Comp. Ex. 12 | 0.15 | 2.01 | 24 | 250 | 48 | 460 | 1.0 | 3.8 | CaO | CeO$_2$ | Dy$_2$O$_3$ | Ca-sialon |
| Comp. Ex. 13 | 0.14 | 1.62 | 11 | 150 | 27 | 60 | 1.0 | 3.8 | CaO | CeO$_2$ | Dy$_2$O$_3$ | Ca-sialon |
| Comp. Ex. 14 | 0.11 | 2.50 | 12 | 150 | 28 | 10.8 | 1.0 | 3.8 | CaO | CeO$_2$ | Dy$_2$O$_3$ | — |
| Comp. Ex. 15 | 0.16 | 2.50 | 13 | 150 | 29 | 10.8 | 1.0 | 3.8 | CaO | CeO$_2$ | Dy$_2$O$_3$ | Ca-sialon |

| | Starting material composition (g) | | | | | | |
|---|---|---|---|---|---|---|---|
| | Cryst. Si$_3$N$_4$ | Amor. Si$_3$N$_4$ | AlN | Metal oxide MO | Lanthanide oxide Ln$_x$O$_y$ | Dy$_2$O$_3$ | α-sialon |
| Example 10 | 0 | 480.0 | 117.0 | 24.2 | 48.5 | 6.94 | 0 |
| Example 11 | 0 | 469.7 | 114.3 | 33.8 | 28.1 | 6.94 | 0 |
| Example 12 | 0 | 437.4 | 106.4 | 38.7 | 18.8 | 0 | 42.2 |
| Example 13 | 0 | 437.3 | 106.3 | 26.4 | 35.7 | 6.94 | 39.4 |
| Example 14 | 0 | 437.3 | 106.3 | 22.6 | 43.8 | 6.94 | 39.4 |
| Example 15 | 0 | 439.9 | 107.1 | 12.7 | 53.5 | 6.94 | 38.8 |
| Example 16 | 0 | 438.3 | 106.6 | 33.8 | 28.4 | 0 | 42.2 |
| Example 17 | 0 | 435.5 | 105.9 | 22.6 | 44.3 | 6.94 | 39.4 |
| Example 18 | 0 | 438.4 | 106.7 | 24.1 | 47.4 | 0 | 42.2 |
| Example 19 | 0 | 440.7 | 107.2 | 22.0 | 45.1 | 6.94 | 39.4 |
| Example 20 | 0 | 436.2 | 106.0 | 31.6 | 26.6 | 6.94 | 39.4 |
| Example 21 | 0 | 437.5 | 106.4 | 19.0 | 36.1 | 6.94 | 38.8 |
| Example 22 | 0 | 440.9 | 107.2 | 18.1 | 53.4 | 6.94 | 41.6 |
| Example 23 | 0 | 441.3 | 107.4 | 16.0 | 63.5 | 0 | 42.2 |
| Comp. Ex. 9 | 0 | 470.3 | 114.4 | 24.2 | 46.9 | 6.94 | 0 |
| Comp. Ex. 10 | 0 | 468.9 | 114.1 | 24.2 | 47.4 | 6.94 | 0 |
| Comp. Ex. 11 | 0 | 465.4 | 113.8 | 29.0 | 37.5 | 6.94 | 37.6 |
| Comp. Ex. 12 | 0 | 440.6 | 107.2 | 22.7 | 44.5 | 6.94 | 37.6 |
| Comp. Ex. 13 | 0 | 438.3 | 106.6 | 22.6 | 44.6 | 6.94 | 37.6 |
| Comp. Ex. 14 | 452.5 | 0 | 115.7 | 24.2 | 47.4 | 6.94 | 0 |
| Comp. Ex. 15 | 453.6 | 0 | 106.6 | 31.6 | 26.8 | 6.94 | 37.6 |

Cryst.Si$_3$N$_4$: Crystalline silicon nitride
Amor.Si$_3$N$_4$: Amorphous silicon nitride

TABLE 4

| | Firing conditions | | X-ray diffraction | Product composition, excess oxygen and metal impurity content | | | | | | | | | |
|---|---|---|---|---|---|---|---|---|---|---|---|---|---|
| | Nitrogen gas pressure (Atm) | Maximum holding temperature (° C.) | Produced α-sialon phase (wt %) | Product composition (wt %) | | | | | | | Excess oxygen (wt %) | Metal impurity content (ppm) | | |
| | | | | Si | Al | O | N | Modifying metal M | Activator Ln | Co-activator Dy | | Cr | Fe | Ni |
| Example 10 | 1.0 | 1650 | 82 | 41.7 | 11.8 | 4.7 | 32.4 | 2.69 | 5.85 | 0.89 | 2.3 | <1 | 6 | <1 |
| Example 11 | 1.0 | 1620 | 80 | 42.9 | 12.0 | 3.7 | 33.9 | 3.95 | 5.84 | 0.89 | 1.4 | 3 | 42 | 8 |
| Example 12 | 1.0 | 1620 | 92 | 42.8 | 12.0 | 3.4 | 34.1 | 4.50 | 2.31 | 0.88 | 1.0 | <1 | 4 | <1 |
| Example 13 | 1.0 | 1620 | 97 | 42.2 | 11.8 | 3.4 | 33.5 | 3.35 | 4.79 | 0.89 | 1.1 | <1 | 2 | <1 |
| Example 14 | 1.0 | 1620 | 97 | 41.9 | 11.8 | 3.5 | 33.2 | 2.79 | 5.98 | 0.89 | 1.2 | <1 | 2 | <1 |
| Example 15 | 1.0 | 1620 | 96 | 41.6 | 11.7 | 3.5 | 33.0 | 2.29 | 7.06 | 0.89 | 1.3 | <1 | 3 | <1 |
| Example 16 | 1.0 | 1620 | 96 | 42.5 | 11.9 | 3.4 | 33.8 | 3.96 | 3.45 | 0.89 | 1.1 | 3 | 44 | 9 |
| Example 17 | 1.0 | 1620 | 94 | 41.9 | 11.8 | 3.2 | 33.4 | 2.85 | 5.88 | 0.89 | 0.8 | <1 | 2 | <1 |
| Example 18 | 1.0 | 1620 | 88 | 41.6 | 11.7 | 3.4 | 33.1 | 2.79 | 6.66 | 0.90 | 1.1 | <1 | 3 | <1 |
| Example 19 | 1.0 | 1630 | 96 | 41.9 | 11.8 | 3.7 | 33.1 | 2.79 | 5.94 | 0.89 | 1.5 | <1 | 4 | <1 |
| Example 20 | 10 | 1910 | 96 | 42.8 | 12.0 | 3.4 | 34.1 | 4.50 | 2.29 | 0.89 | 1.0 | <1 | 4 | <1 |

TABLE 4-continued

| | | | | | | | | | | | | | | | |
|---|---|---|---|---|---|---|---|---|---|---|---|---|---|---|---|
| Example 21 | 10 | 1800 | 96 | 42.8 | 12.0 | 3.5 | 34.0 | 2.09 | 4.75 | 0.89 | 1.2 | <1 | 4 | <1 |
| Example 22 | 10 | 1800 | 97 | 41.6 | 11.7 | 3.5 | 33.0 | 2.29 | 7.01 | 0.89 | 1.3 | <1 | 4 | <1 |
| Example 23 | 10 | 1920 | 92 | 41.4 | 11.6 | 3.6 | 32.8 | 1.89 | 7.85 | 0.89 | 1.4 | <1 | 4 | <1 |
| Comp. Ex. 9 | 1.0 | 1650 | 65 | 41.9 | 11.8 | 3.8 | 33.1 | 2.83 | 5.85 | 0.89 | 1.4 | 19 | 205 | 39 |
| Comp. Ex. 10 | 1.0 | 1620 | 70 | 41.9 | 11.8 | 3.5 | 33.3 | 2.85 | 5.81 | 0.89 | 1.4 | 24 | 256 | 45 |
| Comp. Ex. 11 | 1.0 | 1650 | 62 | 42.0 | 12.0 | 5.9 | 32.0 | 3.23 | 4.47 | 0.85 | 4.1 | 18 | 206 | 38 |
| Comp. Ex. 12 | 1.0 | 1590 | 91 | 41.7 | 11.7 | 3.8 | 32.9 | 2.82 | 6.21 | 0.89 | 1.3 | 26 | 258 | 50 |
| Comp. Ex. 13 | 1.0 | 1600 | 80 | 41.6 | 11.7 | 3.5 | 33.0 | 2.81 | 5.80 | 0.89 | 1.1 | 12 | 153 | 28 |
| Comp. Ex. 14 | 1.0 | 1650 | 20 | 41.8 | 11.8 | 4.1 | 32.9 | 2.80 | 5.78 | 0.89 | 2.0 | 13 | 152 | 29 |
| Comp. Ex. 15 | 1.0 | 1650 | 52 | 42.5 | 11.9 | 3.4 | 33.8 | 3.94 | 3.46 | 0.89 | 2.0 | 14 | 154 | 30 |

| | Powder properties | | | | |
|---|---|---|---|---|---|
| | Specific surface area ($m^2/g$) | Particle size distribution | | | Particle shapes |
| | | 10% size $d_{10}$ | Median size $d_{50}$ | 90% size $d_{90}$ | |
| Example 10 | 1.5 | 2.2 | 4.1 | 9.9 | equiaxial crystals |
| Example 11 | 2.7 | 1.0 | 2.2 | 7.3 | equiaxial crystals |
| Example 11 | 1.4 | 2.4 | 4.3 | 10.2 | slightly amorphous |
| Example 13 | 1.6 | 2.1 | 3.9 | 9.5 | equiaxial crystals |
| Example 14 | 1.5 | 2.3 | 4.1 | 10.2 | equiaxial crystals |
| Example 15 | 1.6 | 2.1 | 4.0 | 10.3 | equiaxial crystals |
| Example 16 | 1.6 | 2.1 | 3.9 | 9.8 | equiaxial crystals |
| Example 17 | 1.8 | 1.4 | 3.2 | 10.5 | equiaxial crystals |
| Example 18 | 2.1 | 1.5 | 2.8 | 9.0 | equiaxial crystals |
| Example 19 | 1.6 | 1.9 | 4.0 | 12.4 | equiaxial crystals |
| Example 20 | 0.7 | 3.7 | 8.9 | 32.2 | equiaxial crystals |
| Example 21 | 1.0 | 3.2 | 6.6 | 20.2 | equiaxial crystals |
| Example 22 | 0.9 | 3.4 | 7.4 | 24.3 | equiaxial crystals |
| Example 23 | 0.7 | 3.7 | 8.8 | 31.7 | equiaxial crystals |
| Comp. Ex. 9 | 2.8 | 1.2 | 2.6 | 9.1 | equiaxial crystals |
| Comp. Ex. 10 | 2.6 | 1.3 | 2.8 | 9.5 | equiaxial crystals |
| Comp. Ex. 11 | 1.2 | 2.7 | 6.6 | 25.6 | equiaxial crystals |
| Comp. Ex. 12 | 2.0 | 1.7 | 3.7 | 12.1 | equiaxial crystals |
| Comp. Ex. 13 | 2.9 | 0.8 | 2.0 | 7.6 | slightly amorphous |
| Comp. Ex. 14 | 3.8 | 0.9 | 1.9 | 6.5 | equiaxial crystals |
| Comp. Ex. 15 | 3.4 | 0.9 | 2.2 | 7.7 | equiaxial crystals |

TABLE 5

| α-Sialon | Chemical composition of produced α-sialon | | | | | | | Emitted light intensity | | Color |
|---|---|---|---|---|---|---|---|---|---|---|
| | Si | Al | O | N | Ca or Mg | Ce | Dy | Mean value (mcd) | Standard deviation (mcd) | |
| Example 11 | 9.3 | 2.7 | 1.3 | 14.6 | 0.60 | 0.25 | 0.03 | 420 | 1.9 | very good |
| Example 16 | 9.3 | 2.7 | 1.2 | 14.8 | 0.60 | 0.15 | 0.03 | 446 | 2.6 | very good |
| Example 17 | 9.3 | 2.7 | 1.2 | 14.8 | 0.44 | 0.26 | 0.03 | 555 | 3.5 | very good |
| Example 18 | 9.3 | 2.7 | 1.2 | 14.8 | 0.44 | 0.30 | 0.03 | 490 | 5.0 | good |
| Example 19 | 9.3 | 2.7 | 1.4 | 14.6 | 0.44 | 0.27 | 0.03 | 494 | 7.2 | very good |
| Example 20 | 9.3 | 2.7 | 1.2 | 14.8 | 0.69 | 0.10 | 0.03 | 266 | 10.8 | very good |
| Example 21 | 9.4 | 2.7 | 1.2 | 15.0 | 0.54 | 0.21 | 0.03 | 266 | 6.0 | very good |
| Example 22 | 9.3 | 2.7 | 1.3 | 14.7 | 0.36 | 0.31 | 0.03 | 341 | 8.3 | very good |
| Example 23 | 9.3 | 2.7 | 1.4 | 14.6 | 0.29 | 0.35 | 0.03 | 370 | 11.2 | very good |
| Comp. Ex. 10 | 9.3 | 2.7 | 1.3 | 14.7 | 0.44 | 0.26 | 0.03 | 240 | 10 | poor |
| Comp. Ex. 12 | 9.3 | 2.7 | 1.4 | 14.6 | 0.44 | 0.28 | 0.03 | 230 | 10.2 | poor |
| Comp. Ex. 13 | 9.3 | 2.7 | 1.3 | 14.7 | 0.44 | 0.26 | 0.03 | 211 | 9.5 | poor |
| Comp. Ex. 14 | 9.3 | 2.7 | 1.5 | 14.5 | 0.43 | 0.26 | 0.03 | 178 | 9.8 | poor |
| Comp. Ex. 15 | 9.3 | 2.7 | 1.2 | 14.9 | 0.61 | 0.15 | 0.03 | 120 | 11 | poor |

According to the process of the invention described above, it is possible to obtain α-sialon-based oxynitride phosphors comprising at least 75 wt % of α-sialon represented by the general formula: $M_xSi_{12-(m+n)}Al_{(m+n)}O_nN_{16-n}$: $Ln_y$, (wherein $0.3 \leq x+y<1.5$, $0<y<0.7$, $0.3 \leq m<4.5$, $0<n<2.25$, and m=ax+by, where a is the valence of the metal M and b is the valence of the lanthanide metal Ln), wherein all or a portion of the metal M dissolved in the α-sialon (where M is at least one type of metal selected from among Li, Ca, Mg, Y or lanthanide metals excluding La and Ce) is replaced with the lanthanide metal Ln as the luminescence center (where Ln is at least one lanthanide metal selected from among Ce, Pr and La), having a content of no greater than 0.01 wt % of metal impurities other than the constituent elements, i.e. the metal M, lanthanide metal Ln, silicon, IIIA elements (aluminum, gallium), oxygen and nitrogen.

Table 5 shows the light emitting properties of 9 different white emitting LEDs fabricated using α-sialon-based oxynitride phosphors of the invention, and all were products with satisfactory properties including high emitted light intensity and low variation in emitted light intensity between the individual LED elements. The colors were pure white and satisfactory. In contrast, the 5 white emitting LEDs fabricated using α-sialon-based oxynitride phosphors outside of the scope of the invention, as comparative examples, all had low emitted light intensity and high variation in emitted light intensity between the individual LED elements, and were therefore unsuitable in terms of product properties. The colors were also bluish, and were judged as unsatisfactory.

Examples 101–106

Silicon diimide with a specific surface area of 750 m²/g obtained by a reaction of silicon tetrachloride with ammonia at below room temperature was thermally decomposed at 700–1200° C. to obtain nitrogen-containing silane compounds and/or amorphous silicon nitride powders with specific surface areas of 60–460 m²/g. Each material was subjected to a known process for improving the condition of chafing between the powder and metal in the reactor material and powder handling machinery, in order to reduce the metal impurities contaminating the nitrogen-containing silane compound and/or amorphous silicon nitride powder to under 10 ppm. Also, by varying the oxygen concentration in the nitrogen gas circulating in the heating furnace to within the range of 20–1000 ppm, the oxygen content of the nitrogen-containing silane compound and/or amorphous silicon nitride powder was adjusted to the values shown in Table 6.

The aluminum nitride (AlN) powder used in all of the examples was AlN powder having an oxygen content of 1.0 wt %, a carbon content of 0.06 wt %, a specific surface area of 3.8 m²/g and a content of metal impurities other than Al, Si and Ca of less than 10 ppm.

The nitrogen-containing silane compound and/or amorphous silicon nitride powder and the aluminum nitride powder used as starting materials were first confirmed to have the prescribed oxygen contents, and then the nitrogen-containing silane compound and/or amorphous silicon nitride powder, aluminum nitride powder, powder of an oxide of a modifying metal element M or an oxide of a rare earth element Ln were combined in the mixing proportions shown in Table 6 using a vibrating mill for 1 hour in a nitrogen gas atmosphere. The powder mixture was molded in a nitrogen-purged glove box, to obtain a molded article with a bulk density of 0.70 g/cm³. The obtained molded article was packed into a silicon carbide crucible and set in a resistance heating electric furnace, and then the temperature was raised at a schedule from room temperature to 1200° C. over a period of 2 hours, from 1200° C. to 1440° C. over a period of 4 hours and from 1440° C. to 1630° C. over a period of 2 hours, in a nitrogen gas atmosphere, after which it was held at the same temperature for one hour for crystallization to obtain α-sialon powder.

The crystal phase of the obtained α-sialon powder was identified by powder X-ray diffraction, while the proportion of α-sialon produced and the solid dissolution of the modifying metal element M or rare earth element Ln were determined by Rietveld analysis. The solid dissolutions of the modifying metal element M or rare earth element Ln are listed as X1 in Table 6, using the values of X in the general formula: $M_xSi_{12-(m+n)}Al_{(m+n)}O_nN_{16-n}$ or $Ln_xSi_{12-(m+n)}Al_{(m+n)}O_nN_{16-n}$.

After next dissolving the powder product by pressurized hydrofluoric acid decomposition method, the chemical composition was analyzed by ICP. The nitrogen content of the powder product was determined by alkali fusion analysis and the oxygen content was determined by inert gas fusion analysis (LECO method). The specific surface area was measured by the BET single-point method. The particle shapes were examined with a scanning electron microscope.

The sialon powder obtained in each of the examples had a mean particle size evenly distributed in the range of 2–7 μm, and the product was confirmed to be α-sialon based on the aforementioned X-ray diffraction and compositional analysis.

The measured values for the crystal phase, chemical composition, specific surface area, particle shapes, etc. of the obtained α-sialon powders are shown in Table 7.

The specifications and mixing ratios for the starting materials of Examples 107 and 108 are also shown in Table 6, and the results of measuring the crystal phase, chemical composition, specific surface area, particle shapes, etc. of the α-sialon powders obtained by the same method as in Examples 101 to 106 are also shown in Table 7.

Example 107

This is an example of changing the nitrogen gas pressure and temperature for firing. α-sialon powder was obtained in approximately the same manner as Example 101, except that the temperature was raised from room temperature to 1200° C. over a period of 2 hours, from 1200° C. to 1440° C. over a period of 2 hours and from 1440° C. to 1800° C. over a period of 3.6 hours, in a pressurized nitrogen gas atmosphere at 10 atmospheric pressure, and then was held at the same temperature for one hour for crystallization.

Example 108

This is an example of adding previously prepared sialon powder. α-sialon powder was obtained in approximately the same manner as Example 101, except that the Ca-α-sialon powder prepared in Example 101 was added.

Comparative Examples 101–104

First, silicon diimide with a specific surface area of 800 m$^2$/g was thermally decomposed at 400–1200° C. to obtain nitrogen-containing silane compounds and/or amorphous silicon nitride powders with specific surface areas of 62–630 m$^2$/g. A known process altering the condition of chafing between the powder and metal in the reactor material and powder handling machinery was employed to obtain nitrogen-containing silane compounds and/or amorphous silicon nitride powders with different contaminating metal impurity contents. Also, the oxygen concentration in the nitrogen gas circulating in the heating furnace was varied to within the range of 5–3000 ppm to obtain nitrogen-containing silane compounds and/or amorphous silicon nitride powders with low oxygen contents, or nitrogen-containing silane compounds and/or amorphous silicon nitride powders with high oxygen contents. These nitrogen-containing silane compounds and/or amorphous silicon nitride powders were used for Comparative Examples 101 to 104, and the methods for preparing the α-sialon powders and the methods for measuring the properties of the α-sialon powders were approximately the same as in Examples 101 to 106. The specifications and mixing ratios of the starting materials are shown in Table 6, and the results of measuring the crystal phase, chemical composition, specific surface area, particle shapes, etc. of the α-sialon powders obtained in the same manner as in Examples 101 to 108 are shown in Table 7.

Comparative Example 101 is an example of a low oxygen content in the nitrogen-containing silane compound and/or amorphous silicon nitride powder, and Comparative Example 102 is an example of a high oxygen content.

Comparative Example 104 an example wherein the firing conditions were changed to 1350° C. In this case, the α-sialon powder was obtained by increasing the temperature and firing at the same temperature increase rate as in Example 101, but with a different final temperature.

Comparative Examples 105–108

Comparative Examples 105 to 108 are examples of using crystalline silicon nitride powder with a specific surface area of about 10 m$^2$/g as the starting material. Mixing of the starting materials was carried out using a wet-type ball mill with ethanol as the solvent. The starting materials had different metal impurity contents, but 150 ppm was exceeded in Comparative Examples 105 and 108.

The bulk density of the molded powder mixture was increased to a value of about 1.2 g/cm$^3$.

In Comparative Example 108, the firing conditions for crystallization were a temperature increase schedule of from room temperature to 1200° C. over a period of 2 hours, from 1200° C. to 1440° C. over a period of 2 hours and from 1440° C. to 1800° C. over a period of 3.6 hours, in a pressurized nitrogen gas atmosphere at 10 atmospheric pressure, followed by holding at the same temperature for one hour.

Examples 109–119 and Comparative Examples 109–113

The following Examples 109 to 119 and Comparative Examples 109 to 113 are examples for α-sialon powder represented by the general formula: $M_xSi_{12-(m+n)}Al_{(m+n)}O_nN_{16-n}:Ln_yDy_z$ containing Dy as a co-activator, unless otherwise specified. The method for preparing the α-sialon powders and the methods for measuring the properties of the produced α-sialon powders were the same as in Example 101, except for the modifications listed for each example. The conditions for preparation of the α-sialon powders are shown in Table 8 and the values of the properties of the produced α-sialon powders are summarized in Table 9.

For Examples 109 to 115, α-sialon powders were obtained in the same manner as Example 101, except that three different metal oxides were used, a modifying metal M oxide (MO), a lanthanide metal Ln oxide ($Ln_xO_y$) as an activator and dysprosium oxide ($Dy_2O_3$) as a co-activator, and the nitrogen-containing silane compound and/or amorphous silicon nitride powder, aluminum nitride powder and the three different metal oxide powders infiltrating in solid solution were mixed for one hour with a vibrating mill in a nitrogen gas atmosphere, in the mixing proportions shown in Table 8. The properties of the obtained α-sialon powders were measured in the same manner as Example 101.

Example 114 is an example of using a nitrogen-containing silane compound and/or amorphous silicon nitride powder with a slightly higher metal impurity content than Examples 109 to 115.

Example 116 is an example of firing using a nitrogen-containing silane compound and/or amorphous silicon nitride powder with an increased oxygen content and a large specific surface area, and with firing in a pressurized nitrogen gas atmosphere.

α-sialon powder was obtained by using a nitrogen-containing silane compound and/or amorphous silicon nitride powder having an oxygen content of 3 wt % and a specific surface area of 600 m$^2$/g or greater, with the oxygen concentration of the nitrogen gas circulating in the heating furnace adjusted up to 1300 ppm, and firing a mixture thereof with aluminum nitride powder and the three different metal oxide powders infiltrating in solid solution, using a temperature increase profile of from room temperature to 1200° C. over a period of 2 hours, from 1200° C. to 1440° C. over a period of 2 hours and from 1440° C. to 1910° C. over a period of 4 hours, in a pressurized nitrogen gas atmosphere of 10 atmospheric pressure.

Examples 117 to 119 are examples of adding Ca-α-sialon powder (Example 119) and Dy-α-sialon powder (Examples 117, 118), obtained in Examples 101 and 106, to one starting material.

A Nihon Bunko FP-777 fluorescent spectrophotometer was used to measure the excitation spectrum of the obtained α-sialon powder for light with a wavelength of 530 nm and the emission spectrum for excitation light with a wavelength of 450 nm.

Figure 4:
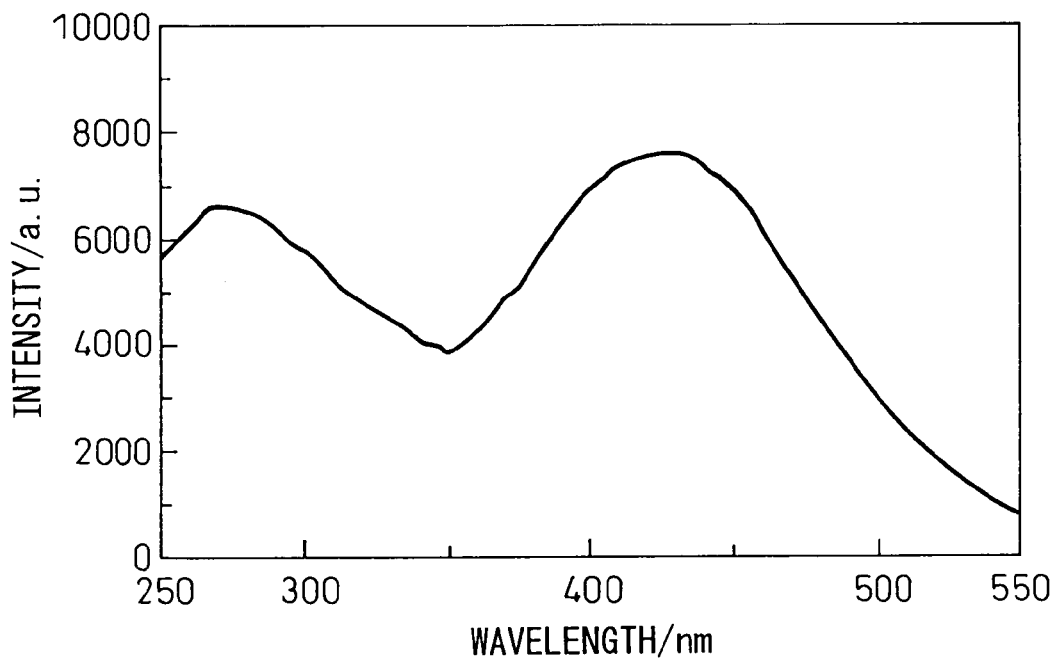
FIG. 4 is a chart showing the excitation spectrum for a Ca-α-sialon phosphor activated with Eu$^{2+}$ ion.
Figure 5:
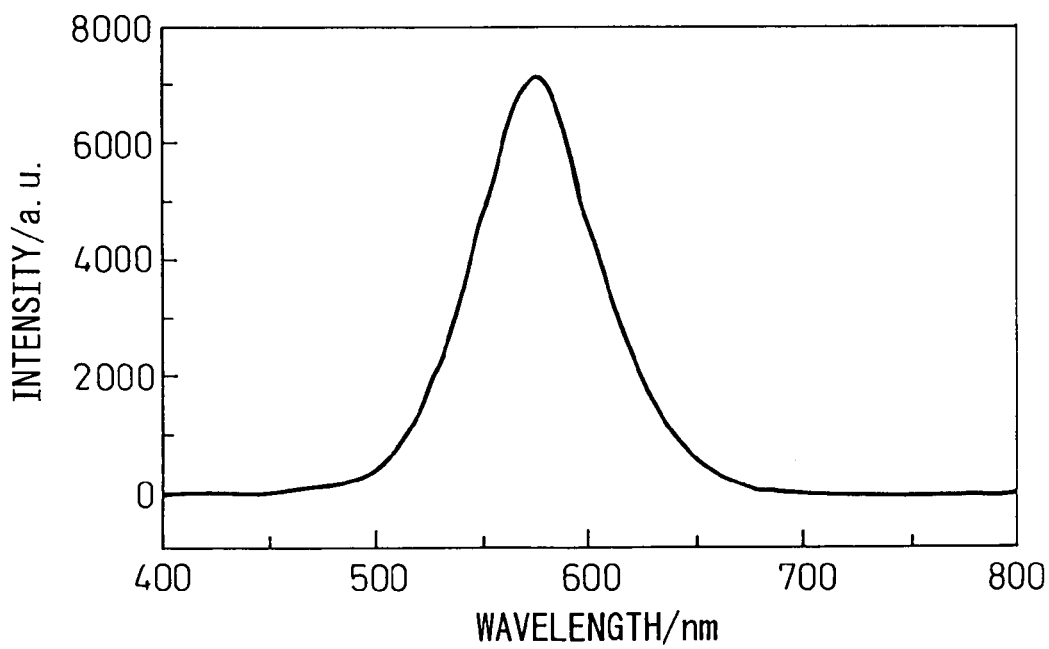
FIG. 5 is a chart showing the emission spectrum for a Ca-α-sialon phosphor activated with Eu$^{2+}$ ion.

The charts in FIG. 4 and FIG. 5 show the excitation spectrum and emission spectrum, respectively, for the α-sialon powder having the compositional formula $Ca_{0.62}Eu_{0.17}Dy_{0.02}Si_{9.3}Al_{2.7}O_{1.3}N_{14.7}$ obtained in Example 118.

Example 119 is an example of preparing α-sialon powder by adding the Ca-α-sialon powder prepared in Example 101 to one starting material, and using a temperature increase profile of from room temperature to 1200° C. over a period of 2 hours, from 1200° C. to 1440° C. over a period of 2 hours and from 1440° C. to 1800° C. over a period of 3.6 hours, in a pressurized nitrogen gas atmosphere of 10 atmospheric pressure, and then holding at the same temperature for one hour.

Comparative Examples 109 to 111 are examples of using nitrogen-containing silane compounds and/or amorphous silicon nitride powders with high metal impurity contents of 200 ppm or greater as starting materials. In Comparative Example 110 the oxygen concentration of the nitrogen gas circulating in the heating furnace was 3000 ppm, and therefore the oxygen content of the nitrogen-containing silane compound and/or amorphous silicon nitride powder is also higher. In Comparative Example 109, the firing temperature is lower than the others. Comparative Example 111 is an example of using a nitrogen-containing silane compound and/or amorphous silicon nitride powder with a low specific surface area of 60 m²/g.

Comparative Examples 112 and 113 are examples of using, as the starting material, a crystalline silicon nitride powder with a high metal impurity content of about 150 ppm and with a specific surface area of about 10 m²/g. The starting materials were mixed using a wet-type ball mill with ethanol as the solvent.

The properties of the phosphors were evaluated in the following manner.

As a translucent resin there was used a liquid epoxy resin having a room temperature viscosity of 50 P. The α-sialon-based oxynitride phosphor obtained as an example or comparative example was combined with the epoxy resin in a weight ratio of 6:100 to obtain a phosphor-dispersed kneaded mixture. The kneaded mixture was coated onto an LED light source for utilization as a fluorescent luminescent layer.

As the light source there was prepared a blue LED provided with an $In_nAl_mGa_{1-(m+n)}N$ nitride-based semiconductor in the light emitting layer. The blue LED 2 was fixed to the recess of the molded package 4 shown in FIG. 1 using the aforementioned epoxy resin. A 35 μm gold wire was used for wire bonding electrical connection between each electrode of the blue LED and each lead electrode 5.

The epoxy resin containing the α-sialon-based oxynitride phosphor was cast into the recess of the molded package 4 on which the blue LED 2 was situated and cured at 120° C. for 4 hours to obtain a white emitting LED having the light source coated with a fluorescent layer.

The emission properties of 500 white emitting LEDs were measured, and the mean values and standard deviation for the emitted light intensity were calculated to determine the variation in properties between elements. The variation in color was also examined.

The results are shown in Table 10.

TABLE 6

| | Starting material types and properties | | | | | | | | | |
|---|---|---|---|---|---|---|---|---|---|---|
| | Amor.Si₃N₄ | | | | | AlN | | Interstitially dissolved metal oxides | | |
| | Carbon content (wt %) | Oxygen content (wt %) | Metal impurity content (ppm) | | | Specific surface area (m²/g) | Oxygen content (wt %) | Specific surface area (m²/g) | Modifying metal M | Activating substance Ln |
| | | | Cr | Fe | Ni | | | | | |
| Example 101 | 0.07 | 1.16 | <1 | 3 | <1 | 360 | 1.0 | 3.8 | CaO | Eu₂O₃ |
| Example 102 | 0.08 | 1.64 | <1 | 4 | <1 | 180 | 1.0 | 3.8 | MgO | Eu₂O₃ |
| Example 103 | 0.06 | 2.26 | <1 | 3 | <1 | 380 | 1.0 | 3.8 | Y₂O₃ | Eu₂O₃ |
| Example 104 | 0.08 | 1.69 | <1 | 4 | <1 | 430 | 1.0 | 3.8 | CaO | Eu₂O₃ |
| Example 105 | 0.11 | 2.53 | <1 | 4 | <1 | 460 | 1.0 | 3.8 | CaO | Eu₂O₃ |
| Example 106 | 0.10 | 2.28 | <1 | 4 | <1 | 460 | 1.0 | 3.8 | CaO | Dy₂O₃ |
| Example 107 | 0.08 | 1.85 | <1 | 4 | <1 | 460 | 1.0 | 3.8 | CaO | Tb₄O₇ |
| Example 108 | 0.08 | 2.09 | <1 | 4 | <1 | 460 | 1.0 | 3.8 | CaO | Eu₂O₃ |
| Comp. Ex. 101 | 0.17 | 0.90 | 3 | 40 | 6 | 62 | 1.0 | 3.8 | CaO | Eu₂O₃ |
| Comp. Ex. 102 | 0.42 | 5.33 | 23 | 250 | 47 | 630 | 1.0 | 3.8 | CaO | Eu₂O₃ |
| Comp. Ex. 103 | 0.07 | 1.16 | 20 | 230 | 45 | 64 | 1.0 | 3.8 | CaO | Eu₂O₃ |
| Comp. Ex. 104 | 0.17 | 1.56 | 4 | 38 | 5 | 430 | 1.0 | 3.8 | CaO | Tb₄O₇ |
| Comp. Ex. 105 | 0.09 | 2.16 | 22 | 250 | 48 | 10 | 1.0 | 3.8 | Y₂O₃ | Eu₂O₃ |
| Comp. Ex. 106 | 0.36 | 2.43 | 4 | 40 | 7 | 10.8 | 1.0 | 3.8 | CaO | Eu₂O₃ |

TABLE 6-continued

| | | | | | | | | | | |
|---|---|---|---|---|---|---|---|---|---|---|
| Comp. Ex. 107 | 0.08 | 2.18 | 3 | 40 | 6 | 10.4 | 1.0 | 3.8 | CaO | $Dy_2O_3$ |
| Comp. Ex. 108 | 0.08 | 1.62 | 13 | 150 | 29 | 10.8 | 1.0 | 3.8 | CaO | $Tb_4O_7$ |

| | Starting material composition (g) | | | | | |
|---|---|---|---|---|---|---|
| | Cryst. $Si_3N_4$ | Amor. $Si_3N_4$ | AlN | Metal oxide MO | Lanthanide oxide $Ln_xO_y$ | Pre-synthesized α-sialon |
| Example 101 | 0 | 464.9 | 113.0 | 47.9 | 5.3 | — |
| Example 102 | 0 | 468.4 | 113.9 | 34.5 | 5.3 | — |
| Example 103 | 0 | 473.1 | 115.2 | 64.4 | 5.3 | — |
| Example 104 | 0 | 468.8 | 114.0 | 2.5 | 100.3 | — |
| Example 105 | 0 | 475.2 | 115.7 | 2.5 | 100.3 | — |
| Example 106 | 0 | 473.2 | 115.2 | 2.5 | 106.3 | — |
| Example 107 | 0 | 470.0 | 114.3 | 2.5 | 104.3 | — |
| Example 108 | 0 | 441.3 | 107.4 | — | 98.7 | 39.5 |
| Comp. Ex. 101 | 0 | 464.5 | 112.9 | 2.5 | 100.3 | — |
| Comp. Ex. 102 | 0 | 498.2 | 121.8 | 2.5 | 100.3 | — |
| Comp. Ex. 103 | 0 | 464.9 | 113.0 | 47.9 | 5.3 | — |
| Comp. Ex. 104 | 0 | 467.8 | 113.8 | 2.5 | 104.3 | — |
| Comp. Ex. 105 | 450.5 | 0 | 115.2 | 64.4 | 5.3 | — |
| Comp. Ex. 106 | 452.6 | 0 | 115.7 | 2.5 | 100.3 | — |
| Comp. Ex. 107 | 450.7 | 0 | 115.2 | 2.5 | 106.3 | — |
| Comp. Ex. 108 | 447.4 | 0 | 114.3 | 2.5 | 104.3 | — |

Cryst. $Si_3N_4$: Crystalline silicon nitride
Amor. $Si_3N_4$: Amorphous silicon nitride

TABLE 7

| | Firing conditions | | X-ray diffraction | | | X2 value based on chemical composition | Product composition and excess oxygen content | | | | | | |
|---|---|---|---|---|---|---|---|---|---|---|---|---|---|
| | | | | | Interstitial | | Product composition (wt %) | | | | | | |
| | Nitrogen gas pressure (Atm) | Maximum hold-ing temperature (° C.) | Produced α-sialon phase (wt %) | X1 value by Rietveld analysis | solid solution ratio X1/X2 | | Si | Al | O | N | Modifying metal oxide M | Activating lanthanide metal Ln | Excess oxygen (wt %) |
| Example 101 | 1.0 | 1630 | 96 | 0.82 | 0.93 | 0.89 | 43.7 | 12.2 | 3.2 | 34.9 | 5.7 | 0.7 | 0.8 |
| Example 102 | 1.0 | 1620 | 93 | 0.79 | 0.89 | 0.89 | 44.7 | 12.5 | 3.6 | 35.5 | 3.5 | 0.7 | 1.2 |
| Example 103 | 1.0 | 1630 | 95 | 0.54 | 0.87 | 0.62 | 42.4 | 11.9 | 3.8 | 33.5 | 8.0 | 0.7 | 1.6 |
| Example 104 | 1.0 | 1630 | 95 | 0.57 | 0.92 | 0.62 | 40.0 | 11.2 | 3.2 | 31.8 | 0.3 | 13.0 | 1.1 |
| Example 105 | 1.0 | 1630 | 96 | 0.52 | 0.85 | 0.62 | 40.0 | 11.2 | 3.8 | 31.4 | 0.3 | 12.9 | 1.7 |
| Example 106 | 1.0 | 1630 | 95 | 0.53 | 0.86 | 0.62 | 39.6 | 11.1 | 3.6 | 31.3 | 0.3 | 13.7 | 1.5 |
| Example 107 | 10 | 1800 | 96 | 0.58 | 0.94 | 0.62 | 39.8 | 11.2 | 3.3 | 31.6 | 0.3 | 13.5 | 1.2 |
| Example 108 | 1.0 | 1630 | >98 | 0.59 | 0.95 | 0.62 | 40.4 | 11.4 | 3.5 | 32.0 | 0.4 | 11.9 | 1.4 |
| Comp. Ex. 101 | 1.0 | 1630 | 70 | 0.47 | 0.77 | 0.62 | 40.0 | 11.2 | 3.0 | 32.0 | 0.3 | 13.1 | 0.6 |
| Comp. Ex. 102 | 1.0 | 1630 | 52 | 0.33 | 0.54 | 0.62 | 39.8 | 11.3 | 5.7 | 30.2 | 0.3 | 12.4 | 4.0 |
| Comp. Ex. 103 | 1.0 | 1630 | 88 | 0.74 | 0.84 | 0.89 | 43.7 | 12.2 | 3.2 | 34.9 | 5.7 | 0.7 | 0.8 |
| Comp. Ex. 104 | 1.0 | 1350 | 30 | 0.33 | 0.54 | 0.62 | 39.8 | 11.2 | 3.2 | 31.6 | 0.3 | 13.5 | 1.1 |
| Comp. Ex. 105 | 1.0 | 1630 | 66 | 0.41 | 0.68 | 0.6 | 42.4 | 11.9 | 3.9 | 33.4 | 8.0 | 0.7 | 1.7 |
| Comp. Ex. 106 | 1.0 | 1630 | 68 | 0.39 | 0.63 | 0.62 | 40.0 | 11.3 | 3.9 | 31.4 | 0.3 | 12.9 | 1.8 |
| Comp. Ex. 107 | 1.0 | 1630 | 71 | 0.41 | 0.66 | 0.62 | 39.6 | 11.1 | 3.7 | 31.2 | 0.3 | 13.7 | 1.6 |
| Comp. Ex. 108 | 10 | 1800 | 75 | 0.45 | 0.73 | 0.62 | 39.7 | 11.2 | 3.4 | 31.5 | 0.3 | 13.5 | 1.3 |

| | Powder properties | |
|---|---|---|
| | Specific surface area ($m^2/g$) | Particle shapes |
| Example 101 | 1.1 | equiaxial crystals |
| Example 102 | 2.1 | slightly amorphous |
| Example 103 | 1.7 | equiaxial crystals |
| Example 104 | 1.8 | equiaxial crystals |
| Example 105 | 1.6 | equiaxial crystals |
| Example 106 | 1.3 | equiaxial crystals |
| Example 107 | 0.9 | equiaxial crystals |
| Example 108 | 1.6 | equiaxial crystals |

TABLE 7-continued

|  |  |  |
|---|---|---|
| Comp. Ex. 101 | 2.5 | equiaxial crystals |
| Comp. Ex. 102 | 1.3 | equiaxial crystals |
| Comp. Ex. 103 | 1.4 | equiaxial crystals |
| Comp. Ex. 104 | 6.5 | equiaxial crystals |
| Comp. Ex. 105 | 1.7 | equiaxial crystals |
| Comp. Ex. 106 | 1.2 | equiaxial crystals |
| Comp. Ex. 107 | 1.3 | equiaxial crystals |
| Comp. Ex. 108 | 1.7 | equiaxial crystals |

TABLE 8

Starting material types and properties

| | Amor.$Si_3N_4$ | | | | | AlN | | Interstitially dissolved metal oxide in solid solution | | | Pre-synthesized α-sialon |
|---|---|---|---|---|---|---|---|---|---|---|---|
| | Carbon content | Oxygen content | Metal impurity content (ppm) | | | Specific surface area | Oxygen content | Specific surface area | Modifying metal M | Activator Ln | Co-activator Dy |
| | (wt %) | (wt %) | Cr | Fe | Ni | ($m^2/g$) | (wt %) | ($m^2/g$) | | | | |
| Example 109 | 0.08 | 1.24 | <1 | 3 | <1 | 180 | 1.0 | 3.8 | CaO | $Yb_2O_3$ | $Dy_2O_3$ | — |
| Example 110 | 0.08 | 1.47 | <1 | 4 | <1 | 360 | 1.0 | 3.8 | CaO | $Er_2O_3$ | $Dy_2O_3$ | — |
| Example 111 | 0.08 | 1.39 | <1 | 4 | <1 | 460 | 1.0 | 3.8 | CaO | $Eu_2O_3$ | $Dy_2O_3$ | — |
| Example 112 | 0.08 | 1.53 | <1 | 4 | <1 | 460 | 1.0 | 3.8 | CaO | $Eu_2O_3$ | $Dy_2O_3$ | — |
| Example 113 | 0.08 | 1.94 | <1 | 4 | <1 | 460 | 1.0 | 3.8 | CaO | $Eu_2O_3$ | $Dy_2O_3$ | — |
| Example 114 | 0.17 | 1.94 | 3 | 40 | 7 | 460 | 1.0 | 3.8 | CaO | $Eu_2O_3$ | $Dy_2O_3$ | — |
| Example 115 | 0.08 | 2.36 | <1 | 4 | <1 | 460 | 1.0 | 3.8 | MgO | $Eu_2O_3$ | $Dy_2O_3$ | — |
| Example 116 | 0.15 | 3.06 | <1 | 6 | <1 | 620 | 1.0 | 3.8 | CaO | $Eu_2O_3$ | $Dy_2O_3$ | — |
| Example 117 | 0.07 | 1.61 | <1 | 3 | <1 | 380 | 1.0 | 3.8 | CaO | $Tb_4O_7$ | — | Dy-sialon |
| Example 118 | 0.08 | 1.67 | <1 | 4 | <1 | 460 | 1.0 | 3.8 | CaO | $Eu_2O_3$ | — | Dy-sialon |
| Example 119 | 0.36 | 1.96 | <1 | 4 | <1 | 650 | 1.0 | 3.8 | CaO | $Eu_2O_3$ | $Dy_2O_3$ | Ca-sialon |
| Comp. Ex. 109 | 0.15 | 2.27 | 24 | 250 | 48 | 460 | 1.0 | 3.8 | CaO | $Eu_2O_3$ | $Dy_2O_3$ | — |
| Comp. Ex. 110 | 0.15 | 5.25 | 17 | 200 | 37 | 430 | 1.0 | 3.8 | CaO | $Eu_2O_3$ | $Dy_2O_3$ | — |
| Comp. Ex. 111 | 0.14 | 1.62 | 11 | 150 | 27 | 60 | 1.0 | 3.8 | CaO | $CeO_2$ | $Dy_2O_3$ | Ca-sialon |
| Comp. Ex. 112 | 0.16 | 2.50 | 13 | 150 | 29 | 10.8 | 1.0 | 3.8 | CaO | $Eu_2O_3$ | $Dy_2O_3$ | — |
| Comp. Ex. 113 | 0.11 | 2.50 | 12 | 150 | 28 | 10.8 | 1.0 | 3.8 | CaO | $CeO_2$ | $Dy_2O_3$ | — |

| | Starting material composition (g) | | | | | | |
|---|---|---|---|---|---|---|---|
| | Cryst. $Si_3N_4$ | Amor. $Si_3N_4$ | AlN | Metal oxide MO | Lanthanide oxide $Ln_xO_y$ | $Dy_2O_3$ | α-sialon |
| Example 109 | 0 | 464.8 | 113.0 | 24.1 | 54.3 | 6.94 | 0 |
| Example 110 | 0 | 466.4 | 113.4 | 24.1 | 52.7 | 6.94 | 0 |
| Example 111 | 0 | 465.9 | 113.3 | 43.5 | 9.7 | 6.94 | 0 |
| Example 112 | 0 | 466.9 | 113.5 | 38.7 | 19.4 | 6.94 | 0 |
| Example 113 | 0 | 470.0 | 114.4 | 24.2 | 48.5 | 6.94 | 0 |
| Example 114 | 0 | 470.0 | 114.4 | 24.2 | 48.5 | 6.94 | 0 |
| Example 115 | 0 | 473.2 | 115.2 | 10.4 | 67.8 | 6.94 | 0 |
| Example 116 | 0 | 480.0 | 117.0 | 24.2 | 48.5 | 6.94 | 0 |
| Example 117 | 0 | 438.4 | 106.7 | 24.1 | 50.4 | 0 | 42.2 |
| Example 118 | 0 | 453.0 | 110.2 | 34.9 | 30.0 | 0 | 21.8 |
| Example 119 | 0 | 442.7 | 107.7 | 22.7 | 45.5 | 6.94 | 39.4 |
| Comp. Ex. 109 | 0 | 472.4 | 115.0 | 24.2 | 48.5 | 6.94 | 0 |
| Comp. Ex. 110 | 0 | 496.7 | 121.0 | 24.2 | 48.5 | 6.94 | 0 |
| Comp. Ex. 111 | 0 | 438.3 | 106.6 | 31.6 | 26.8 | 6.94 | 37.6 |
| Comp. Ex. 112 | 453.6 | 0 | 116.0 | 25.2 | 52.8 | 6.94 | 0 |
| Comp. Ex. 113 | 452.5 | 0 | 115.7 | 24.2 | 47.4 | 6.94 | 0 |

Cryst. $Si_3N_4$: Crystalline silicon nitride
Amor. $Si_3N_4$: Amorphous silicon nitride

TABLE 9

| | Firing conditions | | X-ray diffraction Produced | Product composition, excess oxygen and metal impurity content | | | | | | | | | | |
|---|---|---|---|---|---|---|---|---|---|---|---|---|---|---|
| | Nitrogen gas pressure (Atm) | Maximum holding temperature (° C) | α-sialon phase (wt %) | Product composition (wt %) | | | | | | | Excess oxygen (wt %) | Metal impurity content (ppm) | | |
| | | | | Si | Al | O | N | Modifying metal M | Activator Ln | Co-activator Dy | | Cr | Fe | Ni |
| Example 109 | 1.0 | 1620 | 92 | 41.4 | 11.6 | 3.1 | 33.0 | 2.85 | 7.07 | 0.89 | 0.8 | <1 | 2 | <1 |
| Example 110 | 1.0 | 1620 | 95 | 41.5 | 11.6 | 3.3 | 33.0 | 2.85 | 6.83 | 0.89 | 1.0 | <1 | 3 | <1 |
| Example 111 | 1.0 | 1620 | 96 | 43.1 | 12.1 | 3.3 | 34.3 | 5.05 | 1.22 | 0.88 | 1.0 | <1 | 4 | <1 |
| Example 112 | 1.0 | 1620 | 96 | 42.7 | 12.0 | 3.4 | 34.0 | 4.50 | 2.45 | 0.88 | 1.1 | <1 | 4 | <1 |
| Example 113 | 1.0 | 1620 | 95 | 41.7 | 11.7 | 3.6 | 33.0 | 2.85 | 6.21 | 0.89 | 1.5 | <1 | 3 | <1 |
| Example 114 | 1.0 | 1620 | 95 | 41.7 | 11.7 | 3.6 | 33.0 | 2.85 | 6.21 | 0.89 | 1.4 | 3 | 42 | 8 |
| Example 115 | 1.0 | 1620 | 95 | 41.3 | 11.6 | 3.8 | 32.6 | 1.06 | 8.76 | 0.90 | 1.8 | <1 | 4 | <1 |
| Example 116 | 10 | 1920 | 92 | 41.5 | 11.8 | 5.1 | 31.9 | 2.69 | 6.13 | 0.89 | 2.3 | <1 | 6 | <1 |
| Example 117 | 1.0 | 1620 | >98 | 41.6 | 11.7 | 3.4 | 33.1 | 2.79 | 6.66 | 0.90 | 1.1 | <1 | 3 | <1 |
| Example 118 | 1.0 | 1620 | >98 | 42.5 | 11.9 | 3.4 | 33.8 | 4.08 | 3.82 | 0.46 | 1.3 | <1 | 4 | <1 |
| Example 119 | 10 | 1800 | >98 | 42.0 | 11.8 | 3.7 | 33.2 | 2.84 | 6.29 | 0.89 | 1.3 | <1 | 4 | <1 |
| Comp. Ex. 109 | 1.0 | 1590 | 92 | 41.7 | 11.7 | 3.8 | 32.9 | 2.82 | 6.21 | 0.89 | 1.3 | 26 | 258 | 50 |
| Comp. Ex. 110 | 1.0 | 1650 | 64 | 41.4 | 11.8 | 5.9 | 31.5 | 2.69 | 5.97 | 0.85 | 4.1 | 18 | 206 | 38 |
| Comp. Ex. 111 | 1.0 | 1620 | 84 | 42.5 | 11.9 | 3.4 | 33.8 | 3.94 | 3.46 | 0.89 | 1.1 | 12 | 153 | 28 |
| Comp. Ex. 112 | 1.0 | 1650 | 58 | 41.7 | 11.8 | 4.2 | 32.7 | 2.91 | 6.74 | 0.89 | 2.0 | 14 | 154 | 30 |
| Comp. Ex. 113 | 1.0 | 1650 | 25 | 41.8 | 11.8 | 4.1 | 32.9 | 2.80 | 5.78 | 0.89 | 2.0 | 13 | 152 | 29 |

| | Powder properties | | | | |
|---|---|---|---|---|---|
| | Specific surface area (m²/g) | Particle size distribution | | | |
| | | 10% size $d_{10}$ | Median size $d_{50}$ | 90% size $d_{90}$ | Particle shapes |
| Example 109 | 2.3 | 1.0 | 2.5 | 9.5 | slightly amorphous |
| Example 110 | 2.0 | 1.3 | 2.9 | 9.8 | equiaxial crystals |
| Example 111 | 1.5 | 1.9 | 4.2 | 14.2 | equiaxial crystals |
| Example 112 | 1.5 | 1.9 | 4.4 | 15.0 | equiaxial crystals |
| Example 113 | 1.7 | 1.8 | 4.1 | 14.2 | equiaxial crystals |
| Example 114 | 2.1 | 1.5 | 3.3 | 10.2 | equiaxial crystals |
| Example 115 | 1.8 | 1.7 | 3.9 | 13.7 | equiaxial crystals |
| Example 116 | 0.7 | 3.7 | 8.9 | 32.2 | equiaxial crystals |
| Example 117 | 1.6 | 2.1 | 3.7 | 8.5 | equiaxial crystals |
| Example 118 | 1.8 | 2.0 | 3.8 | 9.9 | equiaxial crystals |
| Example 119 | 0.9 | 3.4 | 7.4 | 24.3 | equiaxial crystals |
| Comp. Ex. 109 | 2.0 | 1.7 | 3.7 | 12.1 | equiaxial crystals |
| Comp. Ex. 110 | 1.2 | 2.7 | 6.4 | 25.1 | equiaxial crystals |
| Comp. Ex. 111 | 2.9 | 0.8 | 2.0 | 7.6 | equiaxial crystals |
| Comp. Ex. 112 | 3.4 | 0.9 | 2.2 | 7.7 | equiaxial crystals |
| Comp. Ex. 113 | 3.8 | 0.9 | 1.9 | 6.5 | equiaxial crystals |

TABLE 10

| α-sialon | Chemical composition of produced α-sialon | | | | | | | Emitted light intensity | | Color |
|---|---|---|---|---|---|---|---|---|---|---|
| | Si | Al | O | N | Ca | Eu | Dy | Mean value (mcd) | Standard deviation (mcd) | |
| Example 111 | 9.3 | 2.7 | 1.2 | 14.8 | 0.76 | 0.05 | 0.03 | 260 | 1.9 | very good |
| Example 112 | 9.3 | 2.7 | 1.2 | 14.8 | 0.69 | 0.10 | 0.03 | 333 | 2.6 | very good |
| Example 113 | 9.3 | 2.7 | 1.3 | 14.7 | 0.44 | 0.26 | 0.03 | 491 | 3.5 | very good |
| Example 114 | 9.3 | 2.7 | 1.3 | 14.7 | 0.44 | 0.26 | 0.03 | 401 | 5.0 | good |
| Example 116 | 9.3 | 2.7 | 1.9 | 14.1 | 0.42 | 0.25 | 0.03 | 351 | 7.2 | very good |
| Example 118 | 9.3 | 2.7 | 1.2 | 14.8 | 0.63 | 0.15 | 0.02 | 451 | 2.8 | very good |
| Comp. Ex. 109 | 9.3 | 2.7 | 1.4 | 14.6 | 0.44 | 0.26 | 0.03 | 254 | 9.8 | poor |
| Comp. Ex. 110 | 9.3 | 2.7 | 2.1 | 13.9 | 0.42 | 0.25 | 0.03 | 135 | 11.2 | poor |
| Comp. Ex. 112 | 9.3 | 2.7 | 1.5 | 14.5 | 0.45 | 0.28 | 0.03 | 183 | 9.0 | poor |

According to the process of the invention described above, it is possible to obtain α-sialon-based oxynitride phosphors comprising at least 90 wt % of α-sialon represented by the general formula: $M_xSi_{12-(m+n)}Al_{(m+n)}O_nN_{16-n}$:$Ln_y$ (wherein $0.3 \leq x+y < 1.5$, $0 < y < 0.7$, $0.3 \leq m < 4.5$, $0 < n < 2.25$, and m=ax+by, where a is the valence of the metal M and b is the valence of the lanthanide metal Ln), wherein all or a portion of the metal M dissolved in the α-sialon (where M is at least one type of metal selected from among Li, Ca, Mg, Y or lanthanide metals excluding La and Ce) is replaced with the lanthanide metal Ln as the luminescence center (where Ln is at least one lanthanide metal selected from among Eu, Dy, Er, Tb and Yb), having a content of no greater than 0.01 wt % of metal impurities other than the constituent elements, i.e. the metal M, lanthanide metal Ln, silicon, IIIA elements (aluminum, gallium), oxygen and nitrogen.

Table 10 shows the light emitting properties of 6 different white emitting LEDs fabricated using α-sialon-based oxynitride phosphors of the invention, and all were products with satisfactory properties including high emitted light intensity and low variation in emitted light intensity between the individual LED elements. The color tones were pure white and satisfactory. In contrast, the 3 different white emitting LEDs fabricated using α-sialon-based oxynitride phosphors outside of the scope of the invention, as comparative examples, all had low emitted light intensity and high variation in emitted light intensity between the individual LED elements, and were therefore unsuitable in terms of product properties. The color tones were also bluish, and were judged as unsatisfactory.

The oxynitride phosphors composed mainly of α-sialon according to the present invention exhibit high emitted light intensity and spectra of appropriate wavelengths, and may therefore be used as high-brightness, high-reliability blue LEDs using ultraviolet-emitting LEDs as light sources. As the host material is α-sialon, the thermal stability, chemical stability and light fastness are excellent, they are advantageous for use as long-lasting photoluminescent phosphors which operate stably even in harsh environments. According to the process of the invention, it is possible to easily fabricate phosphors with such excellent properties on an industrial scale.

The invention claimed is:

1. An α-sialon-based oxynitride phosphor powder characterized in that the content of α-sialon represented by the general formula:

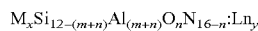

(wherein M is at least one metal selected from among Li, Ca, Mg, Y or lanthanide metals excluding La and Ce,
Ln is at least one lanthanide metal selected from among Ce, Pr and La or at least one lanthanide metal selected from among Eu, Dy, Er, Tb and Yb,
$0.3 \leq x+y < 1.5$,
$0 < y < 0.7$,
$0.3 \leq m < 4.5$,
$0 < n < 2.25$, and
m=ax+by, where a is the valence of the metal M and b is the valence of the lanthanide metal Ln, wherein all or a portion of the metal M dissolved in the α-sialon is replaced with the lanthanide metal Ln as the luminescence center),
is 75 wt % or greater as measured by powder X-ray diffraction when the lanthanide metal Ln is at least one lanthanide metal selected from among Ce, Pr and La or 90 wt % or greater as measured by powder X-ray diffraction when the lanthanide metal Ln is at least one lanthanide metal selected from among Eu, Dy, Er, Tb and Yb, with the remainder consisting of β-sialon and oxynitride glass and in that the content of metal impurities other than the metal M, lanthanide metal Ln, silicon, IIIA elements (aluminum, gallium), oxygen and nitrogen, is no greater than 0.01 wt %.

2. The α-sialon-based oxynitride phosphor powder according to claim 1, wherein the content of oxygen is 3.1 wt % to 5.1 wt %.

3. The α-sialon-based oxynitride phosphor powder according to claim 1, wherein Ln is at least one lanthanide metal selected from among Ce, Pr and La, and the α-sialon content is 90 wt % or greater as measured by powder X-ray diffraction, with the remainder consisting of β-sialon and oxynitride glass.

4. The α-sialon-based oxynitride phosphor powder according to claim 1, wherein Ln is at least one lanthanide metal selected from among Eu, Dy, Er, Tb and Yb, and the α-sialon content is 95 wt % or greater as measured by powder X-ray diffraction, with the remainder consisting of β-sialong and oxynitride glass.

5. The α-sialon-based oxynitride phosphor powder according to claim 1, wherein the content of metal impurities other than the metal M, lanthanide metal Ln, silicon, IIIA elements (aluminum, gallium), oxygen and nitrogen, is no greater than 0.001 wt %.

6. The α-sialon-based oxynitride phosphor powder according to any one of claims 1, 2, 3 or 4, wherein, in a particle distribution curve, the median size is no greater than 8 μm and the degree of dispersion expressed by $d_{90}/d_{10}$ defined by the 10% size ($d_{10}$) and the 90% size ($d_{90}$) is 7 or less.

7. The α-sialon-based oxynitride phosphor powder according to any one of claims 1, 2, 3 or 4, wherein, in a particle distribution curve, the median size is no greater than 8 μm, and the degree of dispersion expressed by $d_{90}/d_{10}$ defined by the 10% size ($d_{10}$) and the 90% size ($d_{90}$) is 25 μm.

8. A process for producing an α-sialon-based oxynitride phosphor powder, wherein a mixed powder comprising a) a nitrogen-containing silane compound and/or amorphous silicon nitride powder having the oxygen content adjusted to 1–5 wt %, b) AlN and/or Al powder, c) an oxide of a metal M or a precursor substance which is converted to an oxide of a metal M upon thermal decomposition, and d) an oxide of a lanthanide metal Ln or a precursor substance which is converted to an oxide of a lanthanide metal Ln upon thermal decomposition, in a combination such that the metal impurity content is no greater than 0.01wt % as calculated on the basis of the product being represented by the general formula:

(wherein M is at least one metal selected from among Li, Ca, Mg, Y or lanthanide metals excluding La and Ce, and
Ln is at least one lanthanide metal selected from among Ce, Pr and La or at least one lanthanide metal selected from among Eu, Dy, Er, Tb and Yb, 0.3≦x+y<1.5,
0<y<0.7,
0.3≦m<4.5,
0<n<2.25, and
m=ax+by, where a is the valence of the metal M and b is the valence of the lanthanide metal Ln), is fired at 1400–2000° C. in a nitrogen gas atmosphere or nitrogen-containing inert gas atmosphere.

9. A process for producing an α-sialon-based oxynitride phosphor powder, wherein a mixture obtained by adding a pre-synthesized α-sialon powder represented by the general formula: $M_xSi_{12-(m+n)}Al_{(m+n)}O_nN_{16-n}$ (wherein the definitions in the formula are the same as below) or the general formula: $M_xSi_{12-(m+n)}Al_{(m+n)}O_nN_{16-n}:Ln_y$ (wherein the definitions of M, Ln, x, y, m and n are the same as below) to a mixed powder comprising a) a nitrogen-containing silane compound and/or amorphous silicon nitride powder having the oxygen content adjusted to 1–5 wt %, b) AlN and/or Al powder, c) an oxide of a metal M or a precursor substance which is converted to an oxide of a metal M upon thermal decomposition, and d) an oxide of a lanthanide metal Ln or a precursor substance which is converted to an oxide of a lanthanide metal Ln upon thermal decomposition, in a combination such that the metal impurity content is no greater than 0.01 wt % as calculated on the basis of the product being represented by the general formula:

$$M_xSi_{12-(m+n)}Al_{(m+n)}O_nN_{16-n}:Ln_y$$

(wherein M is at least one metal selected from among Li, Ca, Mg, Y or lanthanide metals excluding La and Ce, and
Ln is at least one lanthanide metal selected from among Ce, Pr and La or at least one lanthanide metal selected from among Eu, Dy, Er, Tb and Yb,
0.3≦x+y<1.5,
0<y<0.7,
0.3≦m<4.5,
0<n<2.25, and
m=ax+by, where a is the valence of the metal M and b is the valence of the lanthanide metal Ln), is fired at 1400–2000° C. in a nitrogen gas atmosphere or nitrogen-containing inert gas atmosphere.

10. The process according to claim 8 or 9, wherein the specific surface area of the nitrogen-containing silane compound and/or amorphous silicon nitride powder is 80–600m²/g.

11. The process according to claim 8 or 9, characterized in that the content of metal impurities other than Li, Ca, Mg, Al, Si, Ga, Y and lanthanide metals in the nitrogen-containing silane compound and/or amorphous silicon nitride powder and the AlN and/or Al powder is no greater than 0.01 wt %, and the content of carbon is no greater than 0.3 wt %.

12. The process according to claim 11, wherein the content of metal impurities other than Li, Ca, Mg, Al, Si, Ga, Y and lanthanide metals in the nitrogen-containing silane compound and/or amorphous silicon nitride powder and the AlN and/or Al powder is no greater than 0.001 wt %, and the content of carbon is no greater than 0.15 wt %.

13. The process according to claim 8 or 9, wherein the firing is carried out at 1400–1800° C. in a nitrogen-containing inert gas atmosphere at a pressure of 1 atmosphere.

14. The process according to claim 8 or 9, characterized in that the firing is carried out in a temperature range of 1800–1920° C. in a pressurized nitrogen gas atmosphere.

15. The process according to claim 14 characterized in that the firing is carried out in a temperature range of 1600–1900° C. in a pressurized nitrogen gas atmosphere.

16. A light-emitting device comprising:
a light-emitting diode, and
a transparent medium comprising an oxynitride phosphor powder according to claim 1 dispersed therein, and covering the surface of said light-emitting diode.

17. The light-emitting device according to claim 16 wherein said light-emitting diode is a blue light-emitting diode, and said luminescent device is a white light-emitting device.

* * * * *